(12) United States Patent
Kare et al.

(10) Patent No.: US 11,209,570 B2
(45) Date of Patent: Dec. 28, 2021

(54) MULTI-LAYERED SAFETY SYSTEM

(71) Applicant: LASERMOTIVE, INC., Kent, WA (US)

(72) Inventors: Jordin T. Kare, San Jose, CA (US); Thomas J. Nugent, Jr., Bellevue, WA (US); David Bashford, Kent, WA (US); Carsten Casey Erickson, Kent, WA (US); Thomas W. Bashford, Kent, WA (US)

(73) Assignee: LASERMOTIVE, INC., Kent, WA (US)

( * ) Notice: Subject to any disclaimer, the term of this patent is extended or adjusted under 35 U.S.C. 154(b) by 71 days.

(21) Appl. No.: 16/849,872

(22) Filed: Apr. 15, 2020

(65) Prior Publication Data

US 2020/0241165 A1 Jul. 30, 2020

Related U.S. Application Data

(63) Continuation of application No. 15/574,655, filed as application No. PCT/US2016/033139 on May 18, 2016, now Pat. No. 10,634,813.

(Continued)

(51) Int. Cl.
*G01V 8/22* (2006.01)
*G01S 17/87* (2020.01)
(Continued)

(52) U.S. Cl.
CPC ............... *G01V 8/22* (2013.01); *G01S 7/003* (2013.01); *G01S 7/006* (2013.01); *G01S 7/484* (2013.01);
(Continued)

(58) Field of Classification Search
CPC .. G01V 8/22; H02J 50/90; H02J 50/10; H02J 50/30; H02J 50/60; G01S 7/484;
(Continued)

(56) References Cited

U.S. PATENT DOCUMENTS 5,004,908 A 4/1991 Nakamura
9,312,701 B1 4/2016 Mor et al.
(Continued)

FOREIGN PATENT DOCUMENTS

EP 0 329 083 A2 8/1989
EP 1 469 617 A2 10/2004
(Continued)

OTHER PUBLICATIONS

International Search Report, dated Jul. 20, 2016, for International Application No. PCT/US2016/033139, 3 pages.
(Continued)

*Primary Examiner* — Tony Ko
(74) *Attorney, Agent, or Firm* — Seed Intellectual Property Law Group LLP

(57) ABSTRACT

Embodiments are directed towards a safety system that can be used with a high-flux power beam, such as in wireless power transmission. The system includes a transmitter that generates and transmits a power beam and a receiver that receives the power beam. A plurality of sensors is configured to independently detect if an object is near, impeding, or about to impede (i.e., impinging) the power beam. Each of the plurality of sensors is configured to detect the object at different distances between the transmitter and the receiver. A controller triggers the transmitter to stop generating the power beam when any one or more of the plurality of sensors detects the object or a combination of the plurality of sensors detects the object. The controller triggers the (Continued)

transmitter to re-generate and transmit the power beam when each of the plurality of sensors fails to detect the object.

20 Claims, 12 Drawing Sheets

Related U.S. Application Data

(60) Provisional application No. 62/163,307, filed on May 18, 2015.

(51) Int. Cl.

| | | |
|---|---|---|
| *G01S 17/88* | (2006.01) | |
| *G01S 7/00* | (2006.01) | |
| *G01S 7/484* | (2006.01) | |
| *H01S 5/00* | (2006.01) | |
| *H01S 5/062* | (2006.01) | |
| *H01S 5/42* | (2006.01) | |
| *H04B 10/80* | (2013.01) | |
| *H02J 50/60* | (2016.01) | |
| *H02J 50/30* | (2016.01) | |
| *H04B 10/114* | (2013.01) | |
| *G01S 17/04* | (2020.01) | |
| *G01S 17/89* | (2020.01) | |
| *H02J 50/10* | (2016.01) | |
| *H02J 50/90* | (2016.01) | |
| *G01S 17/06* | (2006.01) | |

(52) U.S. Cl.
CPC .............. *G01S 17/04* (2020.01); *G01S 17/06* (2013.01); *G01S 17/87* (2013.01); *G01S 17/88* (2013.01); *G01S 17/89* (2013.01); *H01S 5/005* (2013.01); *H01S 5/0085* (2013.01); *H01S 5/06216* (2013.01); *H01S 5/423* (2013.01); *H02J 50/10* (2016.02); *H02J 50/30* (2016.02); *H02J 50/60* (2016.02); *H02J 50/90* (2016.02); *H04B 10/1141* (2013.01); *H04B 10/807* (2013.01)

(58) Field of Classification Search
CPC .......... G01S 7/006; G01S 17/88; G01S 17/87; G01S 17/89; G01S 7/003; G01S 17/06; G01S 17/026; H01S 5/423; H01S 5/06216; H01S 5/005; H01S 5/0085; H04B 10/807; H04B 10/1141
See application file for complete search history.

(56) References Cited

U.S. PATENT DOCUMENTS

| | | | |
|---|---|---|---|
| 9,520,748 B2 * | 12/2016 | Hyde | ...................... B60L 53/30 |
| 9,838,143 B2 | 12/2017 | Chan et al. | |
| 9,871,387 B1 | 1/2018 | Bell et al. | |
| 9,912,379 B2 | 3/2018 | Hyde et al. | |
| 2002/0046763 A1 | 4/2002 | Berrios et al. | |
| 2003/0075670 A1 | 4/2003 | Tuominen | |
| 2004/0156400 A1 | 8/2004 | Caplan et al. | |
| 2007/0001822 A1 | 1/2007 | Haug | |
| 2012/0314410 A1 | 12/2012 | Leard | |

FOREIGN PATENT DOCUMENTS

| | | |
|---|---|---|
| EP | 1 871 021 A2 | 12/2007 |
| EP | 2 317 347 A2 | 5/2011 |
| WO | 2005/101704 A1 | 10/2005 |

OTHER PUBLICATIONS

International Search Report, dated Jul. 25, 2016, for International Application No. PCT/US2016/033141, 4 pages.

International Search Report, dated Oct. 24, 2016, for International Application No. PCT/US2016/033120, 5 pages.

* cited by examiner

MULTI-LAYERED SAFETY SYSTEM

CROSS-REFERENCE TO RELATED APPLICATION

This application claims the benefit under 35 U.S.C. § 119(e) of U.S. Provisional Patent Application No. 62/163,307, filed on May 18, 2015, entitled "Provisional Patents for Wireless Power" which is hereby incorporated by reference in its entirety.

BACKGROUND

Technical Field

The present disclosure generally relates to systems and methods to detect objects that are impeding or about to impede (i.e., impinging on) a high-flux power beam, and more particularly, but not exclusively to, a plurality of safety systems working cooperatively with one another to detect objects and interrupt transmission of the high-flux power beam.

Description of the Related Art

Wireless delivery of power is of utility for many applications, including unmanned aerial vehicles and personal electronic devices such as laptops and smartphones. Power beaming directs focused electromagnetic power, most often laser light, from a transmitter to a receiver in order to deliver power wirelessly. One concern is that the beam intensity may need to be above accepted safety thresholds to deliver adequate power. Shutting off the beam before anything can enter it is one general way to overcome this problem, but it can be difficult to detect objects before they enter the beam. It is with respect to these and other considerations that the embodiments described herein have been made.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which in and of itself may also be inventive.

BRIEF SUMMARY

Embodiments are directed towards a safety system that can be used with a high-flux power beam, such as in wireless power transmission. The system includes a transmitter that generates and transmits a power beam, a receiver that receives the power beam, and a plurality of sensors that are configured to independently detect if an object is near, impeding, or about to impede (i.e., impinging on) the power beam.

Each of the plurality of sensors is configured to detect objects within a particular volume of space. This detection volume may depend on the size, reflectivity, or other characteristic of a particular object. In some embodiments, the detection volume of one or more sensors may include at least a portion of the power beam path. In some embodiments, the detection volume of one or more sensors may be proximate to at least a portion of the power beam path without including the beam path. That is, the volume may enclose, or lie adjacent to, a portion of the power beam path. Different sensors may have identical, overlapping, or non-overlapping detection volumes. For example, the plurality of sensors may include a first sensor for a first range of distances along the beam path, as measured from the transmitter, a second sensor for a second range, and a third sensor for a third range, the first range being closest to the transmitter and partially overlapping a first portion of the second range, the third range being closest to the receiver and partially overlapping a second portion of the second range.

In some embodiments, at least one sensor may be configured such that its detection volume maintains a constant position relative to the power beam transmitter or receiver, or relative to another object such as a relay mirror, or relative to a portion of the power beam itself. That is, one or more sensors may be attached to the transmitter or receiver, or may be configured to track the position of the transmitter or receiver, or may be configured to point along the axis of the power beam as the power beam itself is steered relative to the transmitter, or as the receiver changes orientation relative to the power beam.

In some embodiments, the plurality of sensors includes a plurality of cameras that capture a plurality of images of the object from different angles. The plurality of images are compared by a digital processor to triangulate a position of the object and determine if the object is near, impeding, or about to impede (i.e., impinging on) the power beam based on the triangulated position of the object. In other embodiments, the plurality of sensors includes a plurality of rangefinders, where some or each of the plurality of rangefinders is configured for a different target distance or range between the transmitter and the receiver. In yet other embodiments, the plurality of sensors includes an ultrasonic sensor for a first range of distances from the transmitter, an infrared sensor for a second range from the transmitter, and a radar sensor for a third range from the transmitter. In some other embodiments, at least one of the plurality of sensors includes a light curtain that surrounds the power beam. Various different combinations of sensors may also be employed.

In some embodiments, each of the plurality of sensors provides an intrusion detected signal to the controller when a corresponding sensor detects the object. The controller, in response to receiving an intrusion detected signal from any of the plurality of sensors, directs or otherwise causes the transmitter to turn off the power beam, or to reduce its power to a safe level. In other embodiments, each of the plurality of sensors provides intrusion detection information to the controller when the particular sensor detects a potentially intruding object. The controller generates an intrusion probability based on a weight of the intrusion detection information received from one or more of the plurality of sensors and automatically powers down the transmitter when the intrusion probability exceeds a predetermined threshold. In some embodiments, the controller triggers the transmitter to re-generate and transmit the power beam when each of the plurality of sensors fails to detect the object.

In various embodiments, at least one of the plurality of sensors includes a single-ended sensing system that includes an emitter and a detector. The emitter emits a time-varying optical signal that is substantially parallel to the power beam and is reflected off a reflector. In some embodiments, the time-varying optical signal is generated based on a time-varying electrical signal provided by a timing source. The detector generates an output based on a return signal from the time-varying optical signal. In some embodiments, the detector generates an electrical signal indicating light-intensity output and a pulsed or otherwise distinguishable output based on the returned signal. The single-ended sensing system also includes intensity-threshold circuitry that provides a first trigger to the controller when the light-intensity output is outside a first threshold and time-of-flight circuitry that provides a second trigger to the controller when a delay between the pulsed output and the time-varying electrical signal exceed a second threshold. The controller automatically disables the transmitter in response to receiving the first trigger or the second trigger.

In a first embodiment, a system includes a transmitter to generate a power beam, a receiver to receive at least a portion of the power beam, and a plurality of sensors. The plurality of sensors are arranged to independently detect when an object is impinging on the power beam. At least a first set of one or more sensors of the plurality of sensors is arranged to detect the object at or within a first detection volume between the transmitter and the receiver, and at least a second set of one or more sensors of the plurality of sensors is arranged to detect the object at or within a second detection volume between the transmitter and the receiver, the first detection volume different from the second detection volume. The system of the first embodiment also includes a controller to interrupt transmission of the power beam to the receiver when, based on information from one or more of the plurality of sensors, an object is determined to be impinging on the power beam.

In some cases of the first embodiment, the plurality of sensors includes a plurality of cameras to capture a plurality of images of the object from one or more angles. In this case, the controller is arranged to compare information associated with the position of the object in the plurality of images, triangulate a position of the object, and determine if the object is impinging on the power beam based on the triangulated position of the object.

In some cases of the first embodiment, the plurality of sensors includes a plurality of rangefinders. At least one of the plurality of rangefinders is arranged to detect the object at or within the first detection volume and at least another one of the plurality of rangefinders is arranged to detect the object at or within the second detection volume.

In some cases of the first embodiment, the plurality of sensors includes an ultrasound-based sensor, an infrared-based sensor, and a radar-based sensor. Each of the ultrasound-based sensor, infrared-based sensor, and radar-based sensor is arranged to detect the object at or within a different distance between the transmitter and the receiver In some cases of the first embodiment, the plurality of sensors includes a third sensor arranged to detect the object at or within a third detection volume between the transmitter and the receiver. Here, the first detection volume includes a first distance range closest to the transmitter, the second detection volume includes a second distance range partially overlapping a portion of the first distance range, and the third detection volume includes a third distance range closest to the receiver and partially overlapping a portion of the second distance range.

In some cases of the first embodiment, the plurality of sensors includes a third sensor arranged to detect the object within a first radial distance from a central axis of the power beam and a fourth sensor arranged to detect the object within a second radial distance from the central axis of the power beam.

In some cases of the first embodiment, one or more of the plurality of sensors is arranged to provide an intrusion-detected signal to the controller when the one or more of the plurality of sensors detects the object. The controller, in response to the intrusion-detected signal from any of the plurality of sensors, is arranged to automatically interrupt power to the transmitter.

In some cases of the first embodiment, one or more of the plurality of sensors is arranged to provide intrusion detection information to the controller when the one or more of the plurality of sensors detects the object. The controller is arranged to generate an intrusion probability based on a weight of the intrusion detection information received from at least some of the one or more of the plurality of sensors, and the controller is further arranged to automatically interrupt transmission of the power beam when the intrusion probability crosses a predetermined threshold.

In some cases of the first embodiment, at least one of the plurality of sensors includes an emitter arranged to emit a time-varying optical signal substantially parallel to the power beam toward at least one reflector, and a detector arranged to generate an output based on a reflection of the time-varying optical signal. Here, the controller is arranged to automatically interrupt transmission of the power beam in response to the detector output crossing a predetermined threshold.

In some cases of the first embodiment, at least one of the plurality of sensors includes a timing source arranged to generate a time-varying electrical signal, an emitter positioned in proximity to the transmitter and configured to utilize the time-varying electrical signal to emit a time-varying optical signal toward a reflector positioned in proximity to the receiver, and a detector arranged to generate a light-intensity output and a pulsed output based on a reflection of the time-varying optical signal. The at least one of the plurality of sensors also includes intensity-threshold circuitry arranged to provide a first trigger to the controller when the light-intensity output is outside a first threshold, and time-of-flight circuitry arranged to provide a second trigger to the controller when a delay between the pulsed output and the time-varying electrical signal crosses a second threshold. Here, the controller is arranged to automatically interrupt transmission of the power beam in response to receiving the first trigger or the second trigger.

In some cases of the first embodiment, at least some of the plurality of sensors includes a plurality of light emitters arranged to produce a light curtain that surrounds the power beam. In some cases of the first embodiment, the controller is arranged to trigger the transmitter to transmit the power beam when each of the plurality of sensors fails to detect the object.

In a second embodiment, a method includes transmitting a power beam from a transmitter toward a receiver, and employing a plurality of sensors arranged to independently detect when an object is impinging on the power beam. Here, at least a first set of one or more sensors of the plurality of sensors is arranged to detect the object at or within a first distance between the transmitter and the receiver, and at least a second set of one or more sensors of the plurality of sensors is arranged to detect the object at or within a second distance between the transmitter and the receiver, the first distance different from the second distance. The method also includes receiving, from at least one of the plurality of sensors, information caused by the object impinging on the power beam, determining, using the information from the at least one of the plurality of sensors, that the object is impinging on the power beam, and disabling transmission of the power beam in response to the determination that the object is impinging on the power beam.

In some cases of the second embodiment, employing the plurality of sensors also includes emitting a time-varying optical signal from an emitter that is in proximity to the transmitter toward a reflector that is in proximity to the receiver, receiving a reflection of the time-varying optical signal, generating a light-intensity output based on the return signal, determining if the light-intensity output is outside a threshold value, and in response to the light-intensity output being outside the threshold value, providing the determination that the object is impinging on the power beam.

In some cases of the second embodiment, employing the plurality of sensors also includes generating a time-varying electrical signal, emitting, from an emitter that is in proximity to the transmitter, a time-varying optical signal toward a reflector that is in proximity to the receiver, the time-varying optical signal based on the time-varying electrical signal, and receiving a reflection of the time-varying optical signal. Employing the plurality of sensors further includes generating a pulsed output based on the reflection of the time-varying optical signal, determining if a delay between the pulsed output and the time-varying electrical signal is outside a threshold, and in response to the delay being outside the threshold, providing the determination that the object is impinging on the power beam.

In some cases of the second embodiment, the method also includes receiving intrusion detection information from two or more of the plurality of sensors when the two or more of the plurality of sensors detect the object, generating an intrusion probability based on a weight of the intrusion detection information received from the two or more sensors of the plurality of sensors, and interrupting the power beam when the intrusion probability exceeds a predetermined threshold.

In a third embodiment, a system includes a transmitter that generates a power beam, a receiver that receives the power beam, a reflector positioned in proximity to the receiver, and at least one single-sided sensor. The at least one single-sided sensor includes a timing source configured to generate a time-varying electrical signal, an emitter positioned in proximity to the transmitter, the emitter electrically coupled to the timing source and configured to utilize the time-varying electrical signal to emit a time-varying optical signal toward the reflector, a detector configured to generate a light-intensity output and a pulsed output based on a return signal derived from a reflection of the time-varying optical signal, intensity-threshold circuitry electrically coupled to the detector and configured to generate a first trigger when the light-intensity output crosses a first threshold, time-of-flight circuitry electrically coupled to the timing source and the detector, the time-of-flight circuitry configured to generate a second trigger when a delay between the pulsed output and the time-varying electrical signal crosses a second threshold, and a controller electrically coupled to the intensity-threshold circuitry and the time-of-flight circuitry, the controller configured to generate a third trigger, the third trigger arranged to cause interruption of the power beam when the intensity-threshold circuitry generates the first trigger or the time-of-flight circuitry generates the second trigger. The system further includes a processor that interrupts transmission of the power beam when the third trigger is received from the controller.

In some cases of the third embodiment, the system includes a plurality of cameras configured to capture a plurality of images of an object from one or more angles. Here, the processor is configured to compare information associated with the plurality of images, triangulate a position of the object based on the information, and cause interruption of the power beam based on the triangulated position of the object.

In some cases of the third embodiment, the system includes a plurality of rangefinders. At least one of the plurality of rangefinders is arranged to detect the object at or within a first detection volume between the transmitter and the receiver and at least another one of the plurality of rangefinders is arranged to detect the object at or within a second detection volume between the transmitter and the receiver. In the system, the processor is arranged to cause interruption of the power beam when any of the plurality of rangefinders detect an object.

In some cases of the third embodiment, the system includes a first sensor arranged to detect an object at or within a first detection volume between the transmitter and the receiver, wherein the first sensor is closest to the transmitter, a second sensor arranged to detect the object at or within a second detection volume between the transmitter and the receiver, and a third sensor arranged to detect the object at or within a third detection volume between the transmitter and the receiver, wherein the third sensor is closest to the receiver and wherein the first detection volume includes a first distance that is a first distance range closest to the transmitter, wherein the second detection volume includes a second distance that is a second distance range partially overlapping a portion of the first distance range, and wherein the third detection volume includes a third distance that is a third distance range closest to the receiver and partially overlapping the second distance range. Here, the processor is arranged to cause interruption of the power beam when any of the first, second, or third sensors detects the object.

This Brief Summary has been provided to introduce certain concepts in a simplified form that are further described in detail below in the Detailed Description. Except where otherwise expressly stated, the Brief Summary does not identify key or essential features of the claimed subject matter, nor is it intended to limit the scope of the claimed subject matter.

BRIEF DESCRIPTION OF THE SEVERAL VIEWS OF THE DRAWINGS

Non-limiting and non-exhaustive embodiments are described with reference to the following drawings. In the drawings, like reference numerals refer to like parts throughout the various figures unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings.

For a better understanding of the present invention, reference will be made to the following Detailed Description, which is to be read in association with the accompanying drawings.

DETAILED DESCRIPTION

Figure 1:
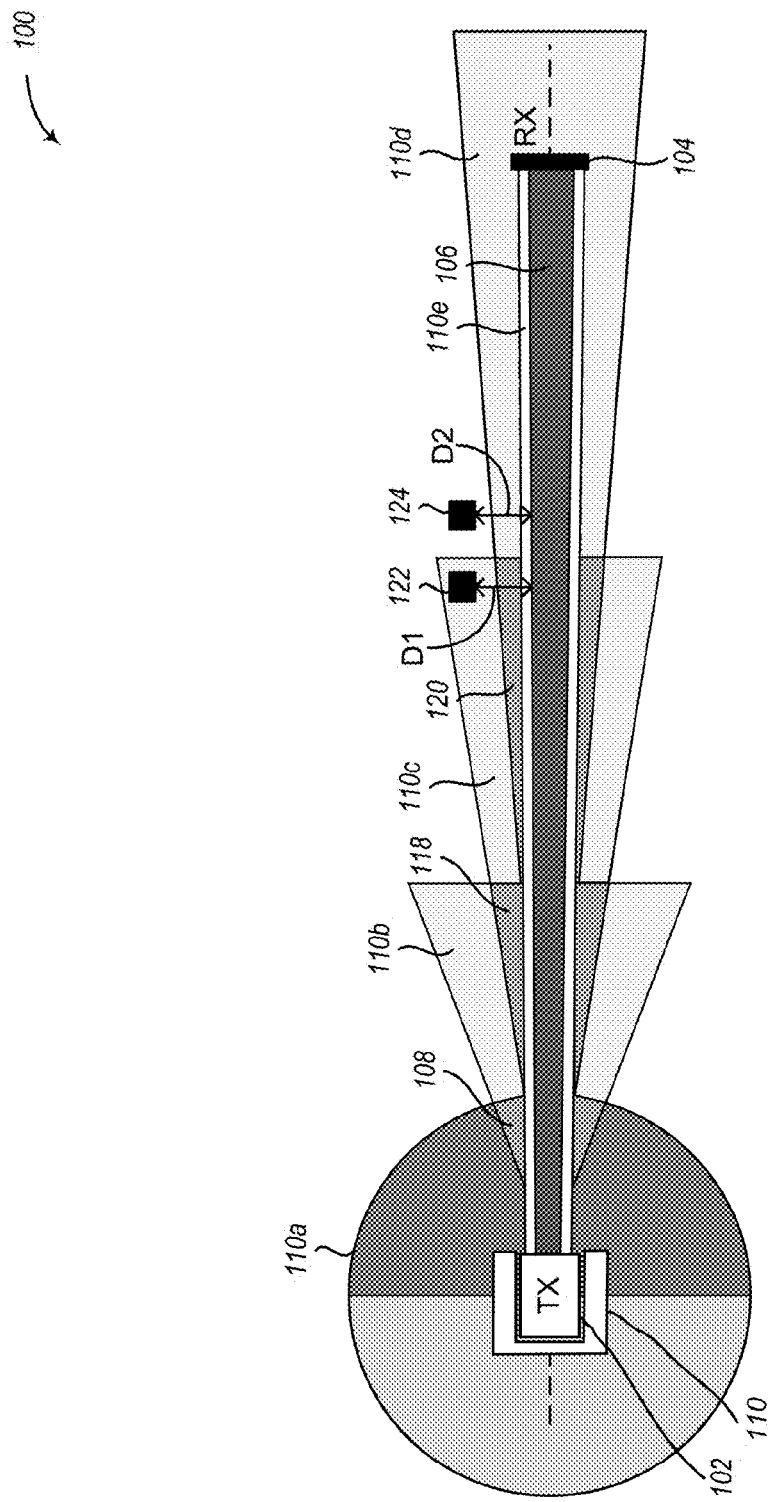
FIG. 1 is a side view illustrative example of a power beam system that utilizes a plurality of safety sensors.

The present application is related to the following applications filed on the same day as the present application, naming the same inventors, and assigned to the same entity; each of said applications incorporated herein by reference to the fullest extent allowed by law: U.S. patent application Ser. No. 15/574,657, entitled LIGHT CURTAIN SAFETY SYSTEM, filed Nov. 16, 2017; U.S. patent application Ser. No. 15/574,659, entitled DIFFUSION SAFETY SYSTEM, filed Nov. 16, 2017; U.S. patent application Ser. No. 15/574,663, entitled POWER BEAMING VCSEL ARRANGEMENT, filed Nov. 16, 2017; U.S. patent application Ser. No. 15/574,667, entitled LOCATING POWER RECEIVERS, filed Nov. 16, 2017; U.S. patent application Ser. No. 15/574,668, entitled WIRELESS POWER TRANSMITTER AND RECEIVER, filed Nov. 16, 2017.

The following description, along with the accompanying drawings, sets forth certain specific details in order to provide a thorough understanding of various disclosed embodiments. However, one skilled in the relevant art will recognize that the disclosed embodiments may be practiced in various combinations, without one or more of these specific details, or with other methods, components, devices, materials, etc. In other instances, well-known structures or components that are associated with the environment of the present disclosure, including but not limited to the communication systems and networks, have not been shown or described in order to avoid unnecessarily obscuring descriptions of the embodiments. Additionally, the various embodiments may be methods, systems, media, or devices. Accordingly, the various embodiments may be entirely hardware embodiments, entirely software embodiments, or embodiments combining software and hardware aspects.

Throughout the specification, claims, and drawings, the following terms take the meaning explicitly associated herein, unless the context clearly dictates otherwise. The term "herein" refers to the specification, claims, and drawings associated with the current application. The phrases "in one embodiment," "in another embodiment," "in various embodiments," "in some embodiments," "in other embodiments," and other variations thereof refer to one or more features, structures, functions, limitations, or characteristics of the present disclosure, and are not limited to the same or different embodiments unless the context clearly dictates otherwise. As used herein, the term "or" is an inclusive "or" operator, and is equivalent to the phrases "A or B, or both" or "A or B or C, or any combination thereof," and lists with additional elements are similarly treated. The term "based on" is not exclusive and allows for being based on additional features, functions, aspects, or limitations not described, unless the context clearly dictates otherwise. In addition, throughout the specification, the meaning of "a," "an," and "the" include singular and plural references.

The term power beam is used, in all its grammatical forms, throughout the present disclosure and claims to refer to a high-flux light transmission that may include a field of light, that may be generally directional, that may be arranged for steering/aiming to a suitable receiver. The power beams discussed in the present disclosure include beams formed by high-flux laser diodes or other like sources sufficient to deliver a desirable level of power to a remote receiver without passing the power over a conventional electrical conduit such as wire.

In the present disclosure, the term "light," when used as part of a safety system such as a single-ended sensing system or guard beam, refers to electromagnetic radiation including visible light, ultraviolet light, and mid- or short-wavelength infrared light. Shorter or longer wavelengths, including soft X-rays and thermal infrared, terahertz (THz) radiation, or millimeter waves, are also considered to be light within the present disclosure when such light can be reflected, blocked, attenuated, or otherwise used to detect obstacles of the sizes and compositions of interest.

The term "single-ended sensing system" refers to a light-based system deployed in proximity to a high-flux power beam and arranged as one or more portions of a safety system wherein a light emitter and a corresponding light detector are in proximity to each other. For example, both the light emitter and the corresponding light detector of the single-ended sensing system are located in proximity (e.g., within tens of millimeters, tens of centimeters, or tens of meters) to the transmitter of the power beam. The light produced by a single-ended sensing system may be formed as a light beam or field at a power level that is comparatively low with respect to the high-flux power beam or some other hazardous region. The partial or complete interruption of such light may be used to indicate the presence of an unsafe object. The interruption of a light beam of the single-ended sensing system may generate one or more control signals that are used to prevent, extinguish, disable, block, or otherwise control the high-flux power beam or other hazard. For example, interruption of such a light beam may generate a control signal used by a safety system to shut down a high-flux power beam transmitter. In some cases the light beam of a single-ended sensing system may only be partially interrupted. In some cases, the light beam of one single-ended sensing system is interrupted while the light beams of other single-ended sensing systems are not interrupted. For example, in some cases, one or more foreign objects may reflect light as a side reflection that is at the edges of the emitted sensor beam(s) or from sensor light that is scattered in the air. In other cases, the one or more light beams of one or more single-ended sensing systems may be fully interrupted, causing a direct reflection due to one or more foreign objects being completely between the respective emitter and a detector.

In the present disclosure, a light source for a single-ended sensing system is referred to as an "emitter." The term emitter is distinguished from the term, "transmitter," which indicates a source of a high-flux power beam. Along these lines, the detection module for a single-ended sensing system includes a "detector." The term "detector" is distinguished from the term, "receiver," which indicates a reception module for a high-flux power beam. Emitters and/or detectors may include various electronic, optical, mechanical, electromechanical, and other components in addition to a light source and a photodetector, respectively, and said components are not described herein for brevity. For example, suitable single-ended sensing system light sources, photodetectors, optical components (e.g., reflectors, lenses, filters, and the like) for visible and non-visible wavelengths are familiar to those of ordinary skill in the use of such wavelengths and not described herein.

The terms "impinge," "impinge on," and the like, as used in the present disclosure, may be understood to include a physical impact, an obstruction in a line of sight path, an interference with, an encroachment of, and to have an effect upon.

Accordingly, physical contact or direct obstruction is not required for one element to impinge on another. Instead, a first element may impinge on a second element if the first element is detected or determined to have an actual or imminent effect on the second element, even if the first element is only near the second element. A non-exhaustive list of words that may interchangeably be used in addition to, in place of, or to better understand any of the grammatical forms of the word "impinge" include, as the context directs: obstruct, encroach, touch, trespass, invade, impede, enter, impose, interfere, intrude, violate, accroach, and obtrude.

In many cases, the flux ($W/m^2$) in an optical high-flux power beam is substantially above the safe limit for exposure to living tissue such as a human or animal eye. In some cases, the flux is high enough to cause eye damage and/or other non-eye damage such as burns or other changes to living tissue. It is thus important to detect when people, animals, or other objects are in or will imminently enter the high-flux beam path during the time the beam is activated. In these and other cases, it may also be important to deter and/or prevent people, animals, and objects from entering the beam path while the beam is activated or will soon be activated.

In addition to direct exposure to a high-flux power beam, hazardous amounts of light may be reflected specularly or diffusely by objects in, or passing through, the power beam. In some cases the high-flux power beam may be intense enough to ignite flammable objects (e.g., paper, cardboard). Thus, unless the beam path is generally inaccessible to objects and living beings (e.g., in outer space), a laser power beaming system is improved by including a safety system arranged to detect hazards, including objects in or near the high-flux beam path, and to shut off the high-flux power beam or prevent the high-flux power beam from being activated.

Except where expressly used to indicate an electrical reduction or removal of power, the term "power down" with reference to the power beam is broadly used, in all its grammatical forms, throughout the present disclosure and claims to refer to an interruption in the transmission of the power beam. In some safety system embodiments described herein, the high-flux power beam is shut off at the source (e.g., by commanding a power supply to turn off, by electrically removing power from the transmitter, by tripping an interlock, or by some other like operation). In some safety system embodiments described herein, the high-flux power beam is blocked (e.g., with a mechanical, electromechanical, or electronic shutter). In still other safety system embodiments described herein, the output flux of the power beam is attenuated or otherwise reduced to a safe level. In addition, it is understood that when the high-flux power beam is shut off, powered down, or otherwise interrupted as described herein, the conditions will also prevent the high-flux power beam from turning on.

In general, embodiments of safety systems described herein may include multiple subsystems or mechanisms for detecting hazards, controlling the high-flux power beam activation, and otherwise providing safety features. Some of the embodiments provide redundant or overlapping coverage.

Some safety systems are employed in connection with other hazards that cannot easily be protected by physical barriers. Optical "fences" are used, for example, to detect when operators reach into hazardous areas around machinery. These other safety systems are very different from the safety systems described herein, however, because high-flux power beams are very different from other types of dangerous machines. For example, as compared to machinery, which is often loud and having moving parts that are visible and often create wind that identifies a possibility of danger to nearby people, a laser power beaming system is often invisible to human eyesight and inaudible to human ears. Laser power beaming systems are also exceptional in the need for very rapid response to small objects due to the possibility of hazardous reflections over a long distance. Improved safety sensors are therefore of high value for power beaming, although they may be useful in other applications as well.

The present invention may be understood more readily by reference to the following detailed description of the preferred embodiments of the invention. The terminology used herein is for the purpose of describing specific embodiments only and is not intended to be limiting. Unless specifically defined herein, the terminology used herein is to be given its traditional meaning as known in the relevant art.

FIG. 1 is a cross-sectional view (i.e., side view) illustrative example of a power beam system 100 that utilizes a plurality of safety sensors 110. The system 100 includes a transmitter 102 that generates and transmits a power beam 106 toward a receiver 104 and the system 100 also includes a plurality of safety sensors 110. In FIG. 1, the plurality of sensors 110 are illustrated as positioned about a transmitter 102 in a particular "horseshoe" shape. Many other arrangements, positions, orientations, combinations of sensors, and the like are also contemplated. A single sensor structure 110 is illustrated in FIG. 1 for ease of understanding the power beam system 100, however, it is recognized that sensors 110 in the power beam system 100 may represent a single sensor, a plurality of sensors, a set of sensors, a plurality of sets of sensors, a plurality of the same type of sensors, a plurality of different types of sensors, and any combination of sensors thereof. The plurality of sensors 110 provide a multi-layered safety system to detect when an object is near, impeding, or about to impede (i.e., impinging on) the power beam 106. The plurality of sensors 110 may include a first set of sensors arranged to generate a first detection volume 110a, a second set of sensors arranged to generate a second detection volume 110b, a third set of sensors arranged to generate a third detection volume 110c, a fourth set of sensors arranged to generate a fourth detection volume 110d, and one or more other sensors arranged to generate a light curtains 110e. More sensors, fewer sensors, and different sensors are also contemplated.

In the power beam system 100, each set of sensors 110 may include one or more sensors 110 of varying capabilities and configurations. For example, sensors 110, as included in the embodiments described herein, may use, without limitation, one or more of the following technologies: Radar, Lidar, Sonar, which may also be referred to as ultrasonic or ultrasound, and other. For each of these technologies, one or more sensors 110 may include monostatic, bi-static, and multi-static implementations using either pulsed or continuous wave signals. Sensors 110 may include thermal infrared (i.e., emissive) imaging technology, including bolometric and radiometric imaging sensors, and sensors 110 may also implement optical imaging technology, including near-infrared (IR), and mid-IR imaging as well as ultraviolet (UV) imaging. The sensors 110 may include structured light scanning technology. In these cases, imaging and structured light sensing sensors 110 may use one, two, or more viewpoints (e.g., stereo imaging) and, if using active illumination, one, two, or more illumination sources. Sensors 110 may be arranged to perform optical beam break sensing, which may also be light curtain sensing, performed with coherent sources, such as laser sources, incoherent sources, or some other light source. In some cases, sensors 110 may include radio-frequency (RF) or ultrasonic beam-interruption sensing technology. Sensors 110 may perform passive RF detection, such as by emitted signals (e.g., radio transmissions, electrical noise, or the like), or sensors 110 may perform passive RF detection such as by reflected signals (e.g., ambient broadcast signals, cellular signals, Wi-Fi signals, or some other signals). In some cases, sensors 110 may be arranged to perform non-imaging passive thermal infrared detection, which may also be referred to as thermal or infrared motion sensors, and sensors 110 may also be arranged to perform some other sensing such as acoustic sensing, vibration sensing (e.g., for noise or motion near a transmitter location), or some other type of sensing.

The plurality of sensors 110 may include, but is not limited to, smart cameras, narrow-field cameras, wide rangefinders, narrow rangefinders, single-ended emitter/detector systems (e.g., as described in FIG. 6), infrared sensors, radar sensors, ultrasound sensors, or other object detecting sensors.

In various embodiments, each sensor 110 is configured to detect objects that are near, impeding, or about to impede (i.e., impinging on) the power beam 106, or any combination thereof, which may be referred to as the effective area of the sensor. In some embodiments, some sensors may be configured to detect different objects in the effective area (e.g., people, cars, birds, etc.), while other sensors may be configured to detect objects at different distances from the transmitter 102 (or the sensor itself), and some sensors may be configured to detect objects based on both type of object and distance from the transmitter 102.

In various embodiments, some sensors can be more or less reliable for different objects at different distances than other sensors. For example a first sensor may be more reliable at detecting a person at 10m than it is at detecting a car at 500 m. Conversely, a second sensor may be more reliable at detecting a car at 500 m than it is at detecting a person at 10 m. The reliability of each sensor depends on its configuration, such as the type of sensor, the technology utilized by the sensor, or the specific settings or parameters of the sensor.

For example, assume that objects 122 and 124 have similar reflective characteristics, such as similar size, direction and rate of travel, distance away from the power beam 106 (illustrated as D1 and D2), etc. In this example, object 124 is further away from the transmitter 102 than object 122. As illustrated, object 122 is within the effective area of a sensor that detects objects within detection volume 110c, whereas object 124 is not in the effective area (i.e., not within the detection volume) of any sensor 110. Accordingly, the sensor that detects objects within detection volume 110c should detect object 122 before the object reaches the power beam 106. However, object 124 will not be detected until it is closer to the power beam 106, at which point the sensor that detects objects within detection volume 110d should detect the object 124. Although FIG. 1 illustrates the sensors 110 as having a finite range and effective detection volume, sensors may be able to detect objects that are outside their effective range and detection volume. The effective detection volume for a sensor is where the sensor meets some acceptable specification for reliability of detection, such as the probability of detecting a real object of specific size is greater than 99%, and where the sensor also has an acceptable false positive rate, which is a detection of an object when none is present. One acceptable false positive rate, which is provided by way of non-limiting example, is when the false positive rate R is less than one per hour (i.e., R<1/hour). With respect to detecting foreign objects that are impinging on a power beam, any particular sensor 110 may still be able to detect objects outside the effective detection volume, but with less sensitivity or lower detection probability. With respect to such sensors 110 as discussed herein, more complex probabilistic analysis of detector (i.e., sensor) performance is of course contemplated, but further details are omitted here for ease in understanding the embodiments.

In various embodiments, multiple sensors may be configured to at least partially overlap in the type of detection that they are performing. In at least one such embodiment, one or more sensors may be configured such that a portion of their effective area overlaps a portion of the effective area of one or more other sensors. An example of overlapping effective areas of multiple sensors is illustrated in FIG. 1. As illustrated, the first set of sensors that detect objects within detection volume 110a and the second set of sensors that detect objects within detection volume 110b are configured to have an overlapping effective area 108; the second set of sensors that detect objects within detection volume 110b and the third set of sensors that detect objects within detection volume 110c are configured to have an overlapping effective area 118; the third set of sensors that detect objects within detection volume 110c and the fourth set of sensors that detect objects within detection volume 110d are configured to have an overlapping effective area 120; and each of the sensors 110 are configured to at least partially overlap the light curtain, which detects objects within detection volume 110e.

As an illustrative example, two rangefinders may be utilized to detect objects adjacent to the power beam but at different ranges or distances from the transmitter 102. One rangefinder may be configured to detect objects between 10 m-50 m away from the transmitter and the other rangefinder may be configured to detect objects between 40 m-100 m away from the transmitter. As a result, each rangefinder is configured to detect objects at different ranges, but with at least some overlapping range.

In other embodiments, sensors may utilize different technologies to overlap a same effective area. For example, cameras and ultrasound sensors may have a same effective area and both are utilized to detect people that are at a same distance from the transmitter 102 and about to intersect the power beam 106. In yet other embodiments, a plurality of sensors may be used to overlap in the types of objects they are configured to detect. For example, a radar sensor and a rangefinder may be configured to detect automobiles at a similar distance from the transmitter.

The overlapping of sensors provides a redundancy that can reduce the number of false negative detections (i.e., an object is impeding or near (i.e., impinging on) the power beam but is not detected), which can be a vulnerability in a single sensor system. The number of sensors that overlap and the amount of overlap between those sensors can be increased or decreased depending on the distance between the transmitter and the receiver, the types of objects to be detected, and the desired redundancy of the safety system. Similarly, the number and types of sensors and their overlapping effective areas described in FIG. 1 is for illustrative purposes only. A voluminous and wide variety of different numbers and types of sensors, and their overlapping effective areas or technologies, have been contemplated and may also be employed, even where such sensors and technologies are not discussed, for brevity.

Figure 2:
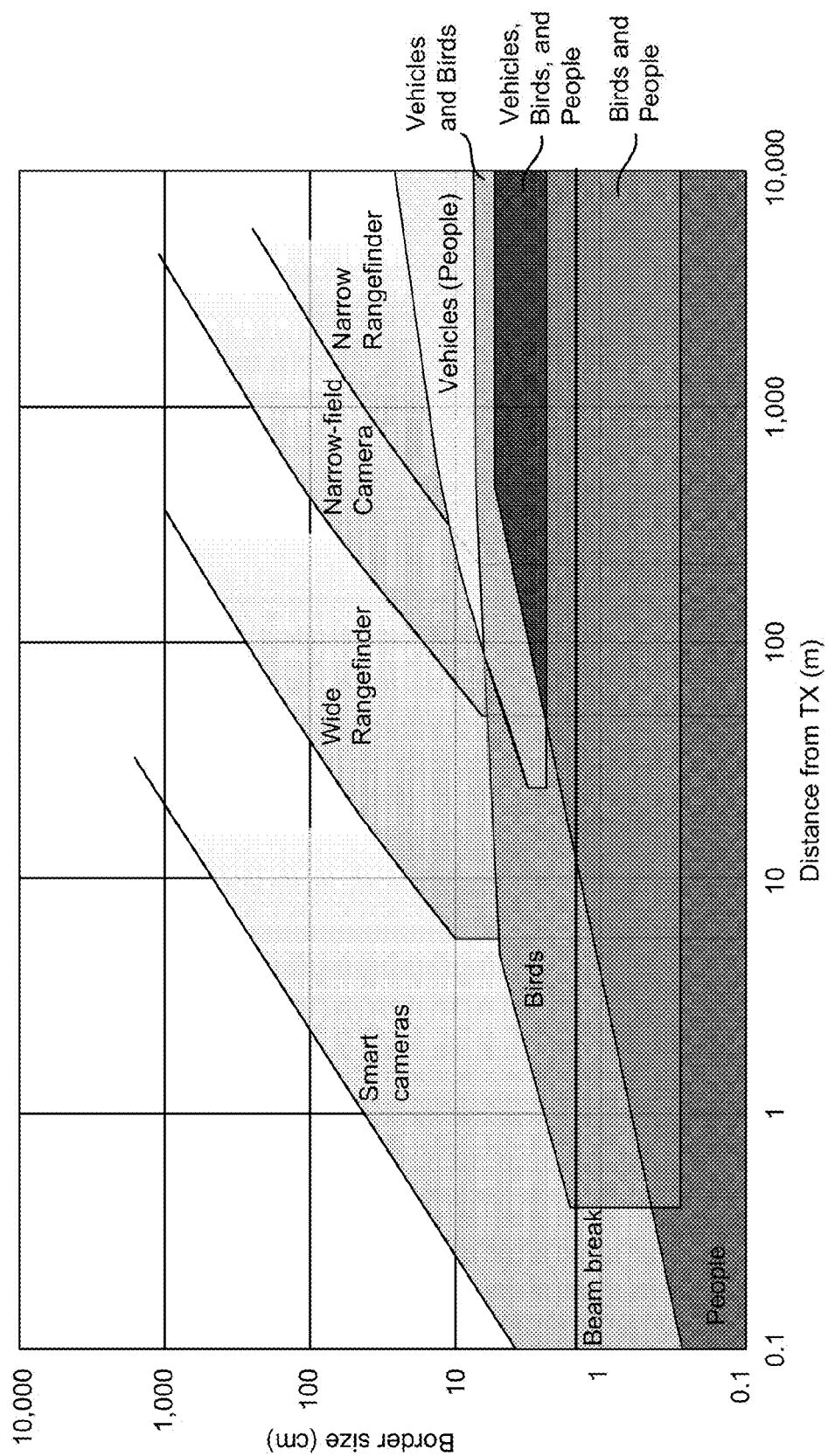
FIG. 2 is a graphical representation of a plurality of safety sensors and their effectiveness for different objects at different ranges.

FIG. 2 is a graphical representation of a plurality of safety sensors and their effectiveness for different objects at different ranges. As illustrated, various different sensors can have different effective areas at different ranges for different objects. This example illustrates the effective areas of smart cameras, a wide rangefinder, a narrow-field camera, a narrow rangefinder, and a beam-break sensor (e.g., a light curtain). As can be seen in the figure, one detection volume parameter, which is represented on the vertical axis of FIG. 2 as a "border size," of the effective areas of the smart cameras, the wider rangefinder, the narrow-field camera, and the narrow rangefinder, increases as their effective area extends away from the transmitter. This expansion of the border may be a byproduct of the technology of the sensors, or it may be designed to provide a wider border to detect objects earlier and further away from the power beam.

Various ones of the sensors are configured to have an effective area that at least partially overlaps the effective area of another sensor. For example, some sensors overlap the beam-break sensor along with at least one other sensor. The smart cameras in some embodiments have an effective area that is the closest to the transmitter but partially overlaps the effective area of the wide rangefinder. The wide rangefinder in some embodiments has an effective area that is the next closest to the transmitter with an effective area that partially overlaps the effective area of the smart cameras and the narrow-field camera. The narrow-field camera in some embodiments has an effective area that is the next closest to the transmitter with an effective area that partially overlaps the effective area of the wide rangefinder and the narrow rangefinder. In some embodiments, the narrow rangefinder has an effective area that is the furthest from the transmitter with an effective area that partially overlaps the effective area of the narrow-field camera. Other sensors having different effective areas may also be used.

Also illustrated are a few examples of overlapping areas of different objects, which moving at the high end of their expected speed ranges, that can be found near the power beam. The sensors may be configured to detect different objects at different borders (i.e., distance away from the power beam) and distances away from the transmitter. This illustration demonstrates those object areas for people, birds, and vehicles, and how they may overlap and be in an effective area of one of the sensors. Other types of objects may also be detected by the sensors at other distances.

Figure 3A:
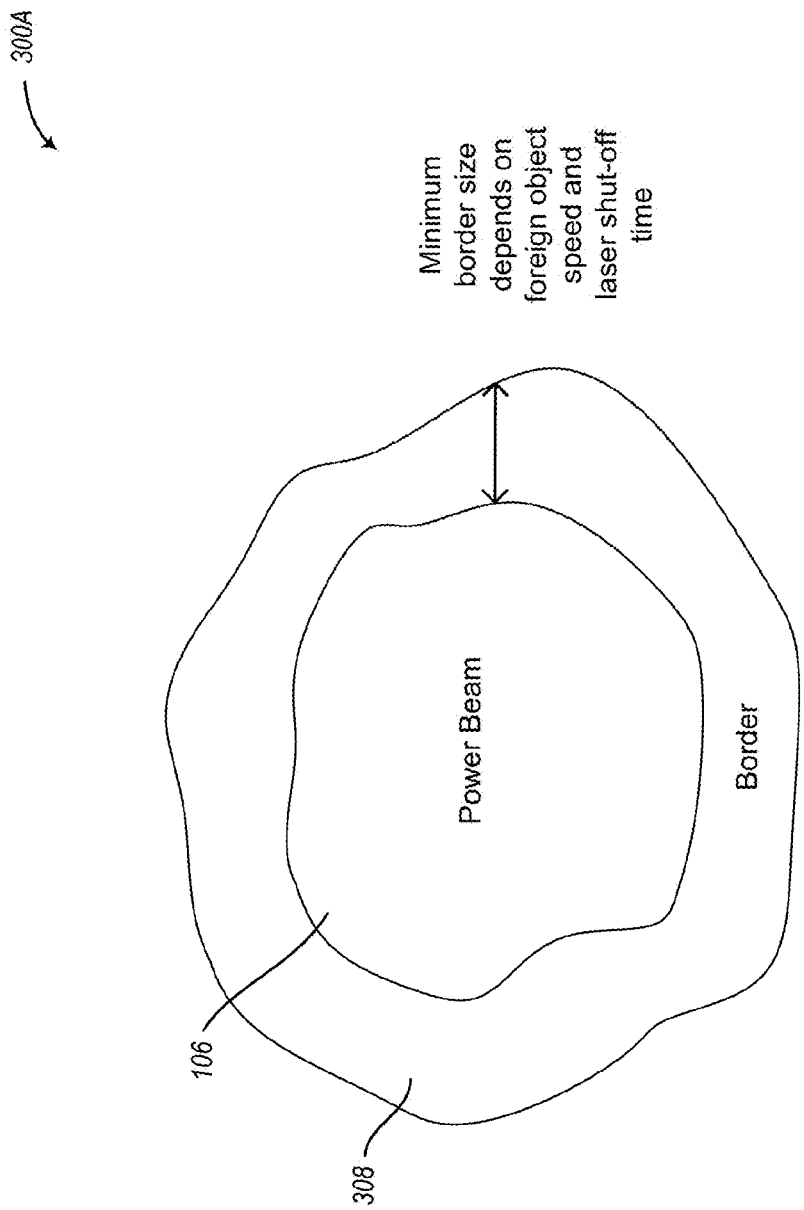
FIGS. 3A-3C are end view illustrative examples of a power beam system that utilizes one or more safety sensors.
Figure 3B:
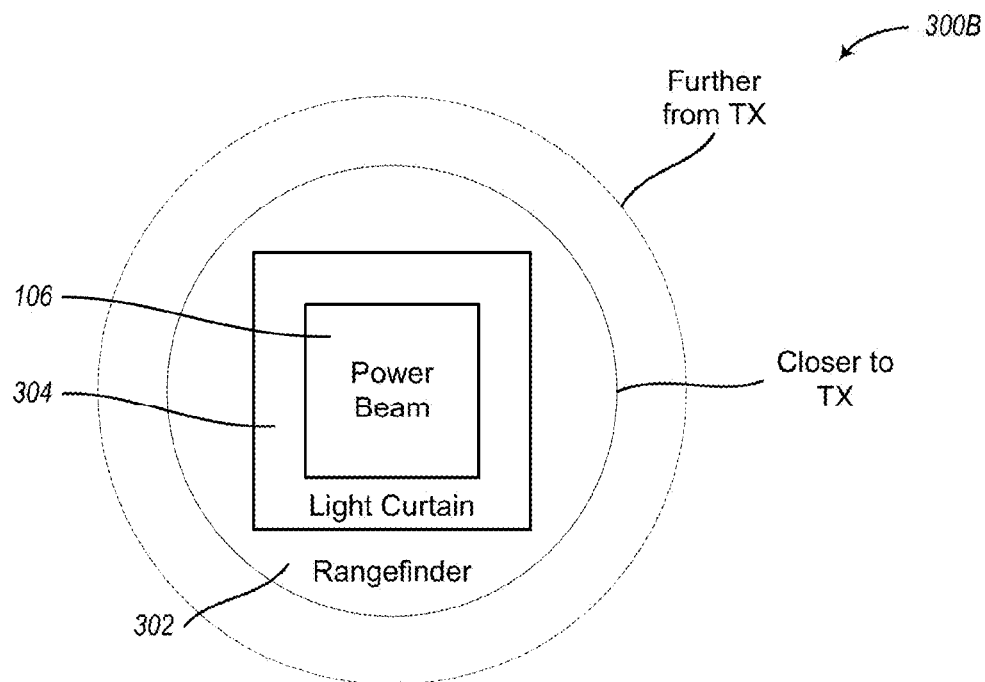
Figure 3C:
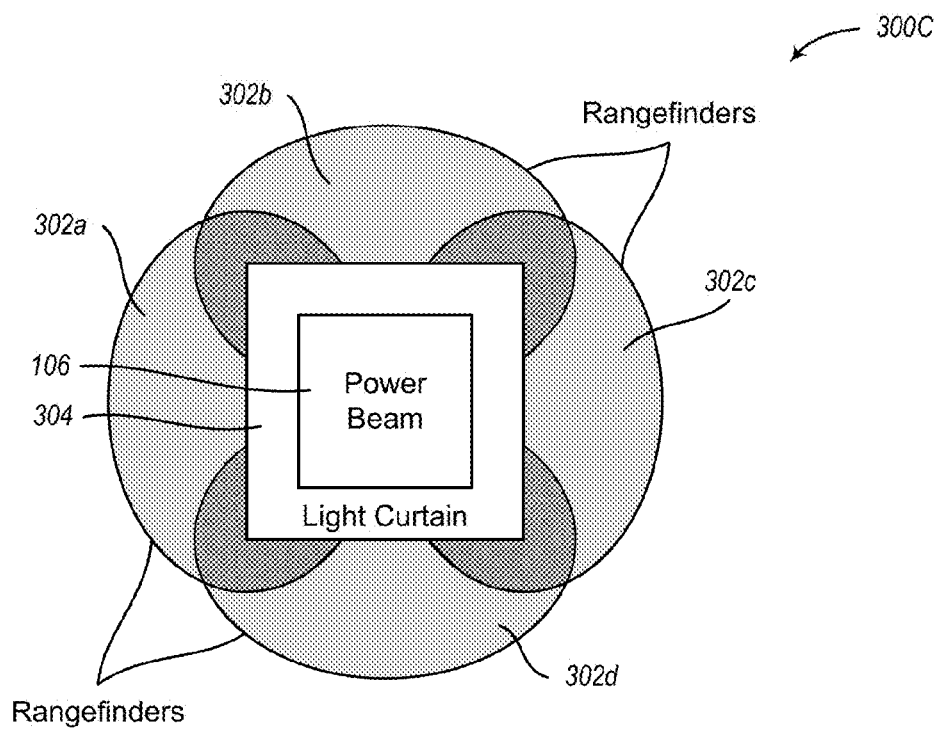

FIGS. 3A-3C are cross-sectional (i.e., end view) illustrative examples of a power beam system that utilizes one or more safety sensors. FIG. 3A shows one example 300A of a sample safety system that illustrates a power beam 106 and a border 308 created by one or more sensors 110 as described herein. The border 308 provides a protective area around the power beam 106 such that if an object enters the border 308 and is detected by a sensor, then the power beam 106 is interrupted (e.g., shut down, blocked, powered down or the like) before the object can reach the power beam 106, which could result in harm to the object. In many situations the power beam 106 may not be able to be instantaneously interrupted due to processing time and limitations of how fast the transmitter can react to interrupt the power beam. As a result, objects that are moving at a high rate of speed may be able to enter the border 308 and enter the path of the power beam 106 before the power beam 106 is interrupted. So, the width of the border 308 around the power beam 106 may be dependent on the types of objects that may impinge on the power beam 106 and how fast they can travel—the higher the speed, the wider the border 308.

FIG. 3B shows one example 300B of a sample safety system that includes a rangefinder 302 (e.g., the wide rangefinder illustrated in FIG. 2) and a light curtain 304. As the effective area of the rangefinder 302 extends from the transmitter, the border around the power beam 106 increases, which can provide additional coverage so that objects are detected further away from the power beam 106. The further an object is detected from the power beam 106, the more likely that the power beam 106 will be completely interrupted before the object reaches the power beam.

FIG. 3C shows one example 300C of a sample safety system that includes a plurality of different rangefinders 302 positioned around the power beam 106. Each rangefinder has an effective area for a different side of the power beam 106. For example, a first rangefinder has an effective area 302a to the left of the power beam 106, a second rangefinder has an effective area 302b to the top of the power beam 106, a third rangefinder has an effective area 302c to the right of the power beam 106, and a fourth rangefinder has an effective area 302d to the bottom of the power beam 106. This configuration of rangefinders provides additional coverage and overlapping effective areas in different directions surrounding the power beam 106.

Figure 4:
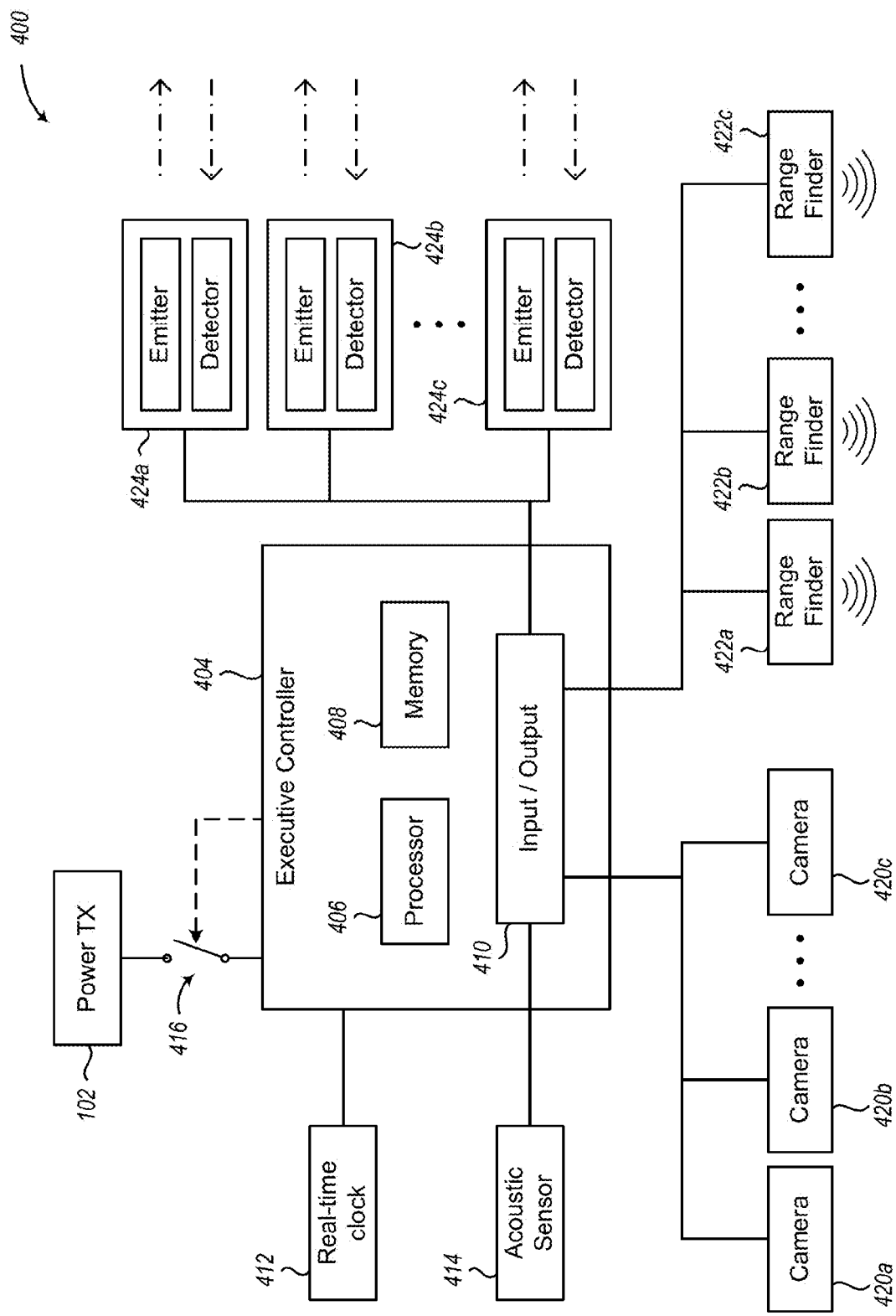
FIG. 4 is a system diagram of a safety system for a power beam.

FIG. 4 is a system diagram of an exemplary safety system 400 for a power beam 106. The system 400 includes a transmitter 102 for generating and transmitting a power beam as described elsewhere herein. The system 400 also includes an executive controller 404 arranged to direct operations of the safety system 400.

The executive controller 404 includes a processor 406, a memory 408, and an input/output interface 410. The processor 406 includes one or more processing units (e.g., central processing units) that execute instructions to perform actions, including actions to perform embodiments described herein to utilize sensor data to interrupt (e.g., shut down, block, power down or the like) the power beam 106. In some embodiments, the executive controller 404 or the processor 406 may also be referred to as a controller. The memory 408 includes one or more types of non-volatile and/or volatile storage technologies. Examples of memory 408 include, but are not limited to, flash memory, hard disk drives, optical drives, solid-state drives, various types of random access memory (RAM), various types of read-only memory (ROM), other transitory and non-transitory computer-readable storage media (also referred to as processor-readable storage media or CRM), or other memory technologies, or any combination thereof. The memory 408 may be utilized to store information, such as the computer-readable instructions that are utilized by the processor 406, and other information, such as, for example, thresholds to compare against sensor data to determine if an object is near, impeding, or about to impede (i.e., impinging on) the power beam.

The input/output interface 410 provides a communication interface between the executive controller 404 and a plurality of sensors. The executive controller 404 receives information from the sensors and, in some embodiments, provides commands to the sensors via the input/output interface 410.

The sensors (e.g., sensors 110 in FIG. 1) in system 400 may include one or more cameras 420, one or more rangefinders 422, one or more single-ended sensing systems 424, one or more acoustic sensors 414, or other sensors. As described elsewhere herein, the sensors may be configured to have different or overlapping (fully or partially) effective areas to detect objects (e.g., same or different objects).

The acoustic sensor 414 may utilize directional listening technology to detect an object. The executive controller 404 utilizes directional information received from the acoustic sensor 414 and a known position of the power beam to determine if there is an object that is near, impeding, or about to impede (i.e., impinging on) the power beam.

The cameras 420a-420c may capture images from various directions. The executive controller 404 analyzes the images to determine if there is an object in one or more of the images that is near, impeding, or about to impede (i.e., impinging on) the power beam. In some embodiments, the executive controller 404 compares multiple sets of images over time to determine if an object is moving towards the power beam 106 and in a path that may intersect the power beam.

The rangefinders 422a-422c may be configured to detect an object near, impeding, or about to impede (i.e., impinging on) the power beam at some distance between the transmitter and the receiver. In various embodiments, each rangefinder 422a-422c is configured for a predetermined range or distance from the transmitter, and if the rangefinder returns a distance from an object that is within the range (or shorter than the predetermined distance) then the object may be detected as being near, impeding, or about to impede (i.e., impinging on) the power beam.

Figure 6:
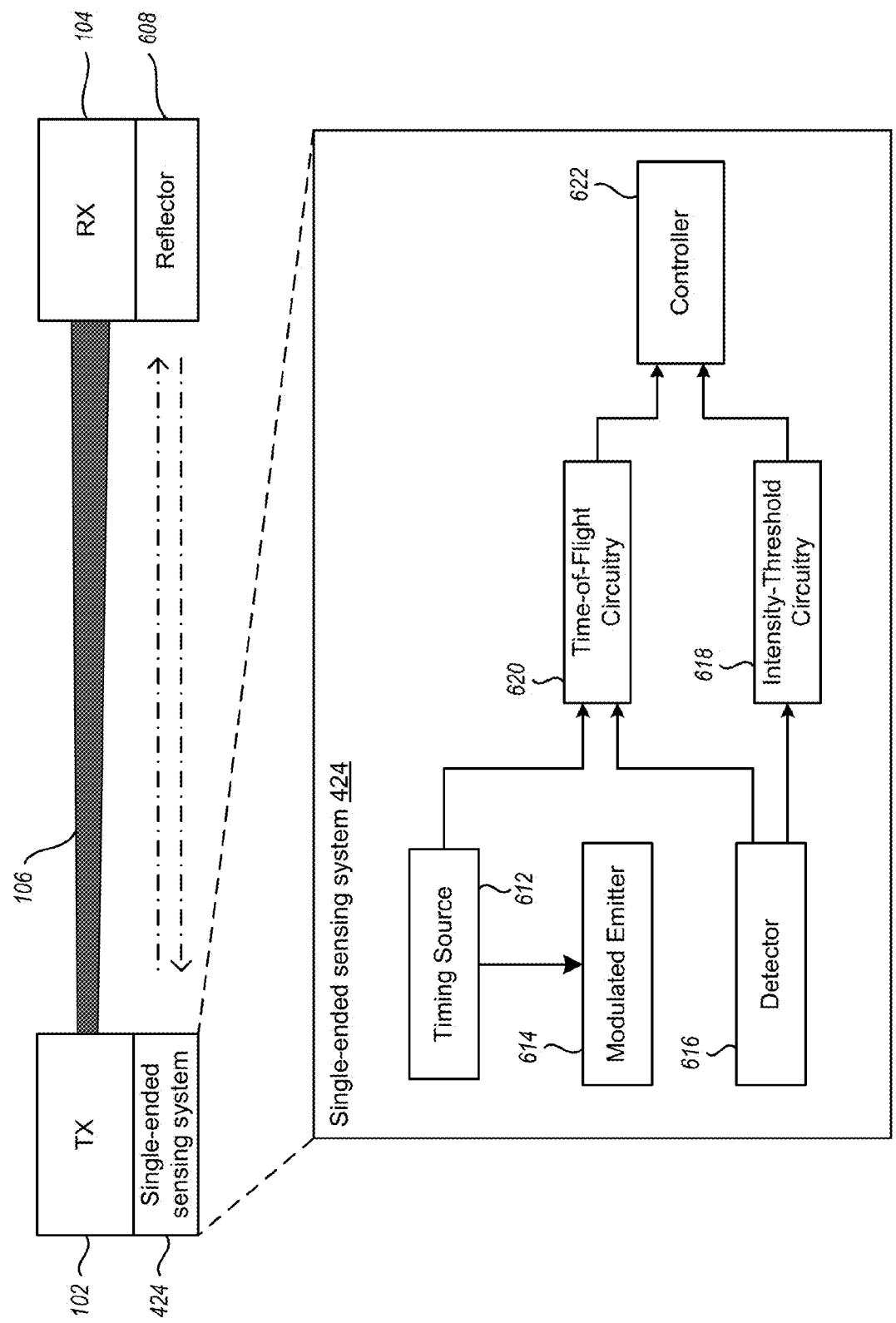
FIG. 6 is a system diagram of a single-ended sensor used with a power beam.

The single-ended sensing systems 424a-424c include an emitter that emits a time-varying optical signal that is reflected back to a detector, which is used to determine if an object is near, impeding, or about to impede (i.e., impinging on) the power beam, as described in more detail in conjunction with FIG. 6 and elsewhere herein. In various embodiments, the single-ended sensing systems 424a-424c may utilize a real-time clock 412 to generate and emit time-varying optical signals.

The executive controller 404 monitors the sensors via the input/output interface 410 for sensor output information regarding detected objects. In some embodiments, some sensors may provide an object-intrusion indication that is a "binary" signal (e.g., yes/no) that is activated when the sensor detects an object. For example, a rangefinder 422 may output a signal that indicates an object detected. In other embodiments, some sensors may provide object-detection information that is associated with the detection of an object (e.g., images from a camera 420, distance reading from a rangefinder 422, intensity or pulsed output values from a single-ended sensing system 424, etc.). The executive controller 404 can utilize the object-detection information and one or more thresholds to determine if an object is near, impeding, or about to impede (i.e., impinging on) the power beam.

In at least one embodiment, the executive controller 404 shuts down the transmitter 102 via switch 416 (e.g., an interlock or another like device) if a single sensor detects an object near, impeding, or about to impede (i.e., impinging on) the power beam. In other embodiments, information from a plurality of sensors may be utilized to determine if an object is near, impeding, or about to impede (i.e., impinging on) the power beam. In various embodiments, information from some sensors is weighted higher (e.g., if a sensor is more reliable) than information from other sensors (e.g., if a sensor is less reliable), such that a combination of the sensor information is compared against one or more thresholds to determine if an object is near, impeding, or about to impede (i.e., impinging on) the power beam.

In embodiments of the safety systems described herein, multiple layers can be used in several ways. For example, since individual safety sensors may be reliable only within a specified range, multiple overlapping safety layers, comprising different sensors, can be utilized such that the various sensors are reliable in different, overlapping ranges. In this way, an entire span from a power beam transmitter to a power beam receiver is covered by one or more of the sensors.

When two or more sensors overlap in their distance coverage, raw data from those sensors can be processed to look for potential signals of foreign objects, even if the data does not cross a defined threshold needed for definite detection. For example, if multiple sensors have sub-threshold signals at the same time or within a selected narrow time window (e.g., less than 1 millisecond, less than 100 milliseconds, less than 5 sec), then that correlation can be used to interrupt the power beam as an added safety measure.

Along these lines, a wide variety of sensors may be employed in the embodiments discussed herein. In some cases, the sensors provide raw data output signals that need to be processed in order to provide useful data for safety sensing. In other cases, individual sensors have circuitry that pre-processes raw signal data before sending processed information to an attached processor or controller. In cases where the sensors send raw data, a higher level processor such as processor 406 analyze raw data and determine when the power beam should be interrupted. In other cases, where a sensor pre-processes data, a higher level processor such as processor 406 may simply receive an indication of object detection or other such high-level information. In these cases, the safety system may process the high-level indication in real time to interrupt the power beam. In still other cases, the executive controller (e.g., processor 406) may have access to both high-level object intrusion information and the raw data from the sensor. In this case, the executive controller can perform more elaborate processing such as combining information from several sensors to determine whether or not the power beam should be interrupted.

As discussed herein, various sensor information may be appropriately analyzed, weighted, and combined in order to determine whether or not the power beam should be interrupted. With respect to rangefinders, for example, if no angular data is available, then distances returned from a sensor that are within a pre-determined range of acceptable ranges may be singly sufficient to trigger power beam interruption. In addition, or in the alternative, if angular data is available from a rangefinder, then the distance from the foreign object to the safety border can be estimated. In cases where there is a gap larger than a selected distance (e.g., a pre-specified distance based on expected velocities and rangefinder sampling rate), then the power beam may be permitted to continue operating without interruption. With respect to beam-break sensors, when a processed signal indicates an approximate distance, the distance can be compared to distances measured from other sources such as rangefinders. The combination of available information can be used in this way to determine whether or not the power beam should be interrupted.

In some embodiments, safety systems include both beam-break devices and rangefinder devices. The beam-break devices may include many emitters and detectors, and the rangefinder devices may include one or more rangefinder units. As discussed herein, these devices may pre-process data before providing the pre-processed data to the executive controller (e.g., processor 406), or the devices might send raw data to the executive controller. The various sensors may operate and provide data at different times, different rates, and having different characteristics. In these cases, the executive controller is arranged to accumulate, buffer, normalize, or otherwise arrange the data for suitable interpretation and analysis. For example, a system may provide pre-processed data from a ring of beam-break sensors and a sparse ring of rangefinders. The beam-break sensors may provide an array of intensity values from the n emitters and m detectors:

$$S_{BB} = \begin{bmatrix} S_{11} & \cdots & S_{1m} \\ \vdots & \ddots & \vdots \\ S_{n1} & \cdots & S_{nm} \end{bmatrix}$$

The rangefinders may provide an array of first, second, or any number of distances measured from each of p rangefinders:

$$S_{RF} = \begin{bmatrix} x_{10} & x_{11} & \cdots \\ \vdots & \vdots & \cdots \\ x_{p0} & x_{p1} & \cdots \end{bmatrix}$$

In these embodiments, the pre-processed data values represented by the arrays $S_{BB}$ and $S_{RF}$ would be passed in a computer format to the executive controller.

Because the different safety sensors might collect data at different rates, the executive controller (e.g., processor 406) analyzes the safety signals at different rates.

When the safety sensor subsystems provide raw data to the executive controller, the executive controller processes the data to detect potential signals that, in the example of rangefinder signals, may not meet all of the criteria to qualify as a determined distance measurement. These sub-threshold signals may be determined to have insufficient individual value to trigger a power beam interruption, but these sub-threshold "noise" signals may be time-correlated with other sub-threshold signals, such as from the beam-break array that are determined to be less likely to indicate a false positive than a single sensor alone. In this way, a combination of signals may be analyzed by the executive controller to trigger a power beam interruption.

Any given safety sensor might only provide actionable results within a certain set of conditions, such as a certain range (i.e., a distance from the sensor to a foreign object). In view of the flexibility of analysis by the executive controller, it is determined that the multiple-layer safety system embodiments described herein apply data from multiple sensors having complementary operating conditions. In this way, coverage conditions to detect foreign objects are improved.

Non-limiting and exemplary operation of certain aspects of the disclosure will now be described with respect to FIGS. 5A-5D. In at least one of various embodiments, processes 500A-500D described in conjunction with FIGS. 5A-5D, respectively, may be implemented by or executed on one or more computing devices, such as executive controller 404, single-ended sensing system 424, or other object detection systems for power beams.

Figure 5A:
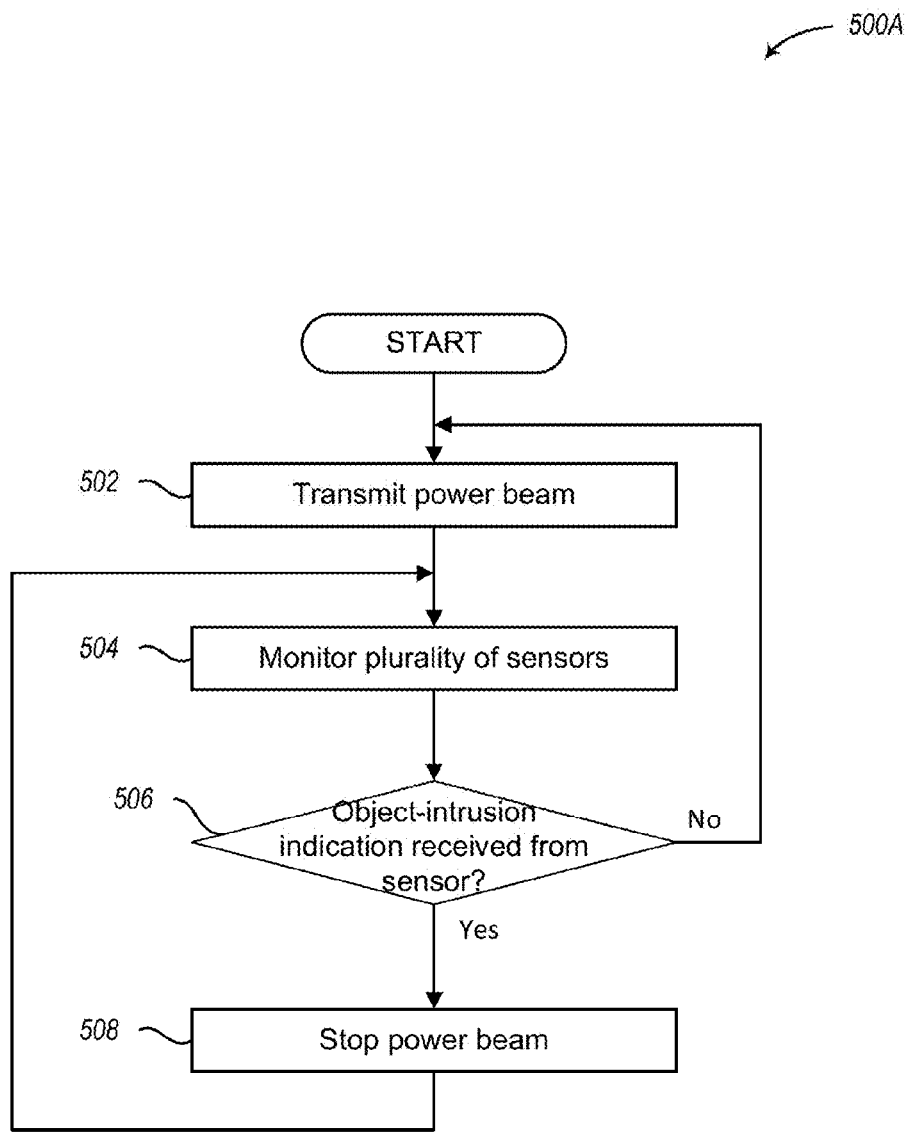
FIG. 5A is a logical flow diagram generally showing one embodiment of a process for utilizing a plurality of safety sensors with a power beam to turn off the power beam.

FIG. 5A is a logical flow diagram generally showing one embodiment of a process 500A for utilizing a plurality of safety sensors with a power beam 106 to interrupt the power beam 106.

Process 500A begins after a start block. At block 502 a power beam 106 is generated and transmitted from a transmitter 102. In various embodiments, the power beam 106 is transmitted to a receiver 104, which is coupled with other circuitry to convert flux from the power beam 106 into electricity. As a result, electronics coupled to the receiver 104 can be wirelessly charged or otherwise receive power derived from the power source of the transmitter 102 and the power beam 106.

Process 500A proceeds to block 504, where a plurality of sensors 110 are monitored for information indicating that an object is impeding, near, or about to impede (i.e., impinging on) the power beam 106. As described elsewhere herein, these sensors utilize a variety of different technologies to detect the presence of an object, and are positioned and configured to detect objects that are impeding, near, or about to impede (i.e., impinging on) the power beam 106. Similarly, sensors can be configured to detect objects that have different characteristics (e.g., size, shape, reflective properties, direction and rate of movement, location, distance from transmitter or sensor, etc.).

When a sensor detects an object or otherwise generates data associated with a detected object, the sensor outputs information regarding the detected object. In some embodiments, the output is an object-intrusion indication, which is a "binary" signal that indicates that the sensor has detected an object. In other embodiments, the output is object-detection information, which includes additional information about the detected object. This additional information may include, but is not limited to, size of the object; location of the object relative to the power beam; distance from the transmitter or sensor; speed and direction the object is moving; or other information that is used to determine if the object is in fact impeding, near, or about to impede (i.e., impinging on) the power beam.

Process 500A continues at block 506, where a determination is made whether an object-intrusion indication is received from one or more of the plurality of sensors. As mentioned above, the object-intrusion indication is a "binary" signal that indicates that an object was detected by the sensor. If an object-intrusion indication is recited from any one of the plurality of sensors, process 500A flows to block 508; otherwise, process 500A loops to block 502 to continue to transmit the power beam and monitor the sensors for object intrusions.

At block 508, the power beam is stopped in response to receipt of the object-intrusion indication. Stopping the power beam may include powering down or halting the power beam, closing a shutter or cap on the transmitter to prohibit the power beam from being projected towards the receiver, putting the power beam into a safe mode of operation, or otherwise terminating the transmission of the power beam from the transmitter.

In various embodiments, a positive indication of a detected object for just one of a plurality of sensors results in the power beam being immediately stopped. In this way, even a false positive detection will result in the power beam being stopped. And since, in some embodiments, the sensor coverage overlaps, there is a higher likelihood that if one sensor misses an object, another sensor will detect it.

In other embodiments, a combination of object-intrusion indications from multiple sensors is used to determine whether the power beam is stopped or not. For example, in at least one embodiment, the power beam will not be stopped unless two or more sensors provide an object-intrusion indication. In this way, a malfunctioning sensor may not unnecessarily keep stopping the power beam. A malfunctioning sensor may be identified when it routinely detects an object in an overlapped sensor area, but the other overlapping sensors do not detect the object. This lack of consistency between sensors may indicate that one of the sensors is less reliable than the others, and such indication may cause the system to determine that one sensor is malfunctioning. In some embodiments, the system may be calibrated or re-calibrated to account for a sensor that is malfunctioning or is consistently providing object-intrusion indications when other sensors are not, which is discussed in more detail below.

After block 508, process 500A loops to block 504 to continue to monitor the plurality of sensors to determine if the object is no longer impinging on the power beam (at decision block 506). If the object is no longer impinging on the power beam the transmitter may begin retransmitting the power beam (at block 502).

Figure 5B:
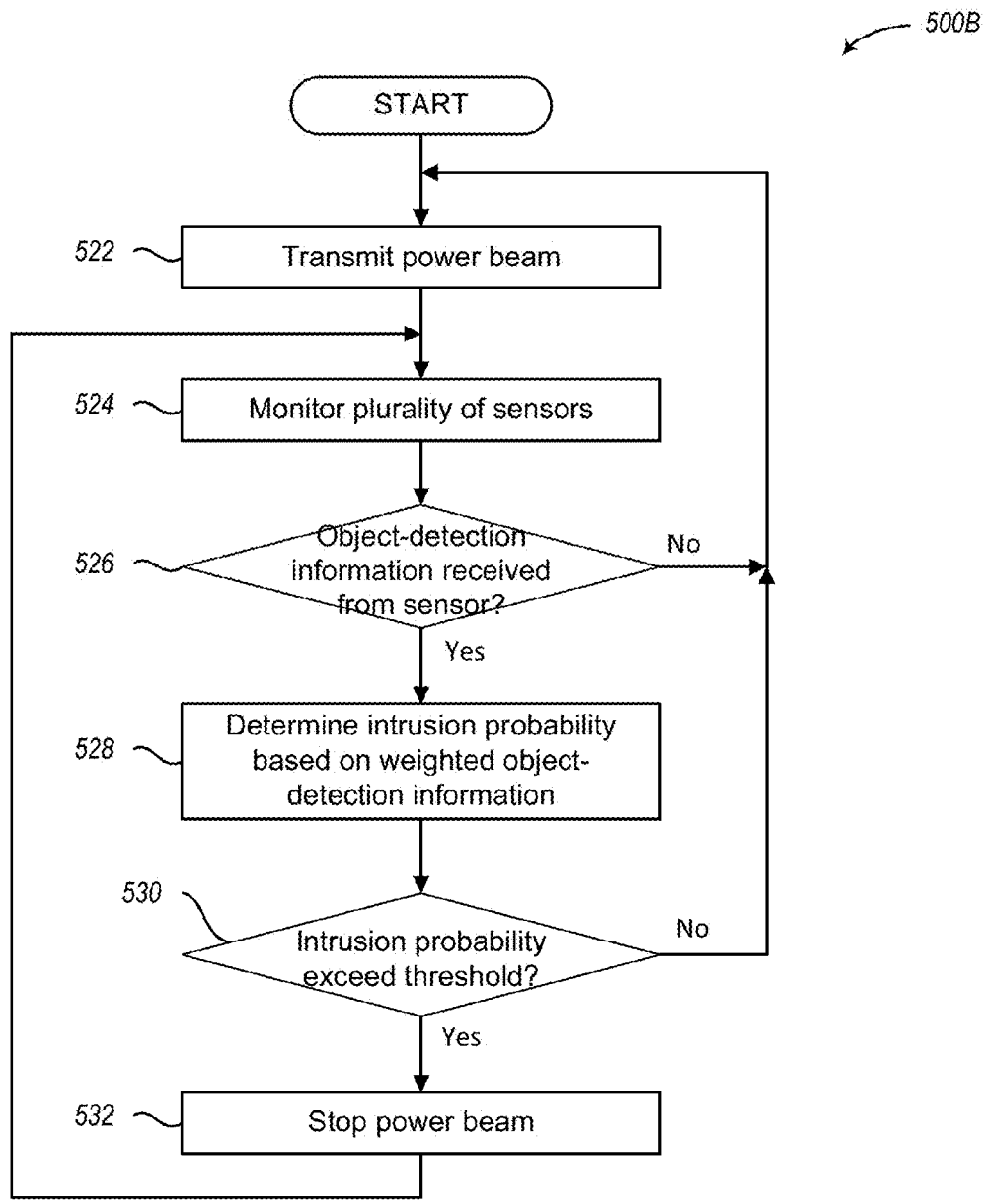
FIG. 5B is a logical flow diagram generally showing one embodiment of a process for utilizing a plurality of safety sensors with a power beam to turn off the power beam based on an intrusion probability of detected objects.

FIG. 5B is a logical flow diagram generally showing one embodiment of a process for utilizing a plurality of safety sensors with a power beam 106 to interrupt the power beam 106 based on an intrusion probability of detected objects.

Process 500B begins after a start block. At block 522, a power beam 106 is transmitted from a transmitter 102. In various embodiments, block 522 may employ embodiments of block 502 in FIG. 5A to transmit the power beam.

Process 500B continues at block 524, where a plurality of sensors are monitored for information indicating that an object is impeding, near, or about to impede (i.e., impinging on) the power beam 106. In various embodiments, block 524 may employ embodiments of block 504 in FIG. 5A to employ and monitor a plurality of sensors.

Process 500B proceeds to decision block 526, where a determination is made whether object-detection information is received from one or more of the plurality of sensors. As mentioned above, the object-detection information is additional information about the detected object, such as size of the object, location of the object relative to the power beam, distance from the transmitter or sensor; speed and direction the object is moving, a value indicating the likelihood that an object was detected, or other information associated with the detection of an object by a sensor. If object-detection information is received from one or more of the plurality of sensors, process 500B flows to block 528; otherwise, process 500B loops to block 522 to continue to transmit the power beam and monitor the sensors for a detected object.

At block 528, an intrusion probability is determined based on the received detection information. In various embodiments, the received detection information is weighted and then combined to calculate the intrusion probability. As mentioned above, different sensors may be more or less reliable for different objects at different distances. Similarly, some sensors may be more or less prone to false positives than other sensors. Accordingly, the detection information can be weighted such that information from less reliable or less reliable sensors (lower weight) has less of an impact on determining whether to stop the power beam than information from more reliable or more reliable sensors (higher weight). In one non-limiting, non-exhaustive example, cameras may be deemed to be less reliable than rangefinders. In this example, the detection information from the cameras is weighted lower than detection information from the rangefinders.

In some embodiments, the weights may be variable and may change based on a variety of different criteria associated with the sensors or the information provided by the sensors. In at least one embodiment, the weights may be determined based on which sensors provide detection information. In this way, the weight for one sensor may change depending on which other sensors provide detection information. This dynamic use of weights may be utilized where a first sensor is less reliable compared to a second sensor, but more reliable compared to a third sensor. For example, if SENSOR_A and SENSOR_B provide detection information, then the weight for SENSOR_A may be 2 and the weight for SENSOR_B may be 3. But if SENSOR_C provides detection information instead of SENSOR_B, then the weight for SENSOR_A may be 4 and the weight for SENSOR_C may be 1. So in this example, the weight of SENSOR_A changed from 2 to 4 because different sensors provided detection information along with SENSOR_A. Although the above description and examples describe a scenario with three sensors having a selected reliability compared to one another, other numbers of sensors, relative accuracies or reliabilities, or other comparators may be utilized.

In various embodiments, the weights may also change based on an approximated distance between the transmitter and the object or an approximated distance between the sensor and the object. Since some sensors are more accurate or more reliable at different distances than other sensors, the weight of a sensor that has a higher accuracy or reliability for the approximated distance to the object may be higher than a sensor with a lower accuracy or reliability at that same distance.

For example, assume SENSOR_A is considered highly accurate and reliable between 0 m and 20 m but very inaccurate or very unreliable at distances over 70 m, whereas SENSOR_B is considered very inaccurate or very unreliable at distances below 50 m but very accurate and reliable at distances between 75 m and 200 m. If an object is detected at an approximate range of 10 m, then any information received from SENSOR_A may be weighted higher than any information received from SENSOR_B because SENSOR_A is more accurate, more reliable, or more accurate and more reliable at the 10 m distance than SENSOR_B. In comparison, if the object is detected at an approximate range of 100 m, then any information received from SENSOR_B may be weighted higher than any information received from SENSOR_A because SENSOR_B is more accurate, more reliable, or more accurate and more reliable at the 100 m distance than SENSOR_A. In yet another example, if the object is detected at an approximate range of 60 m, then any information received from SENSOR_A and SENSOR_B may be similarly weighted because the object is outside the high accuracy zone, the high reliability zone, or both the high accuracy and high reliability zone of both sensors. The specific sensors and distances discussed herein are merely for illustrative purposes and do not to limit the disclosure in any way. Different criteria (other than distance) have been contemplated and may of course be used. For example, an approximate shape, size, reflectiveness, speed of the object, or other variable information that may impact a sensor's accuracy, reliability, or other factors may also be used.

In various embodiments, the weights and other parameters may also be determined or changed by a calibration process. For example, in some embodiments, the weights may be set based on the sensor outputs when no object is impinging on the power beam or when one or more known objects are intentionally impinging on the power beam at known distances from the transmitter.

In circumstances where the object is located in an inaccurate or unreliable zone of a sensor, information from that sensor may still be valuable. In some high-flux power beam technology embodiments it is sometimes better to err on the side of caution (i.e., turn the power beam off if a sensor detects an object even though no objects are impeding or near (i.e., impinging on) the power beam) so that no objects, including people, are injured from the power beam.

Once the intrusion probability is determined, process 500B proceeds to decision block 530, where a determination is made whether the intrusion probability exceeds a threshold. In some embodiments, the threshold may be predetermined or set by an operator. In other embodiments, the system may be put into a calibration mode and can collect information from each sensor while the power beam is transmitting and there are no objects impinging on the power beam, similar to what is described above in determining the weights. This information can be analyzed and compared to calibrate the threshold necessary to affirmatively detect an object and stop the power beam.

In some embodiments, the operator may put pre-known objects near or into the power beam at predetermined distances so that the system can collect the detection information from each of the plurality of sensors to further calibrate or update the intrusion threshold based on the detection information and the specific information regarding the known object (e.g., distance from transmitter, size, shape, reflectance, or other measurables that may be picked up or alter the output of a sensor).

If the intrusion probability exceeds the threshold, then process 500B flows to block 532 to stop the beam; otherwise, process 500B returns to block 522 to continue to transmit the power beam and monitor the sensors for object intrusions.

At block 532, the power beam is stopped in response to the intrusion probability exceeding the threshold. In various embodiments, block 532 may employ embodiments of block 508 of FIG. 5A to stop the power beam.

After block 532, process 500B loops to block 524 to continue to monitor the plurality of sensors to determine if the object is no longer impinging on the power beam (via blocks 526, 528, and 530). If the object is no longer impinging on the power beam the transmitter may begin retransmitting the power beam (at block 522 via blocks 526 or 530).

Figure 5C:
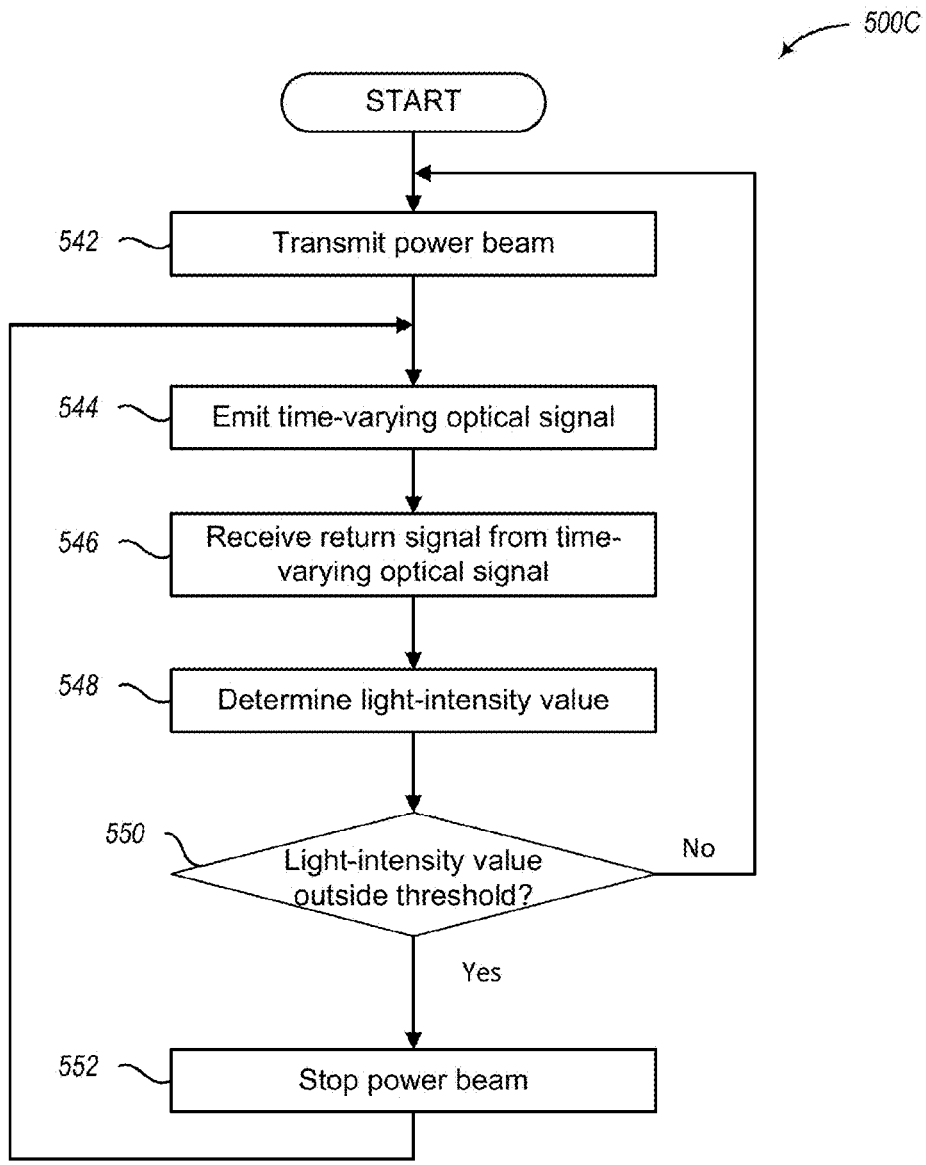
FIG. 5C is a logical flow diagram generally showing one embodiment of a process for utilizing a single-ended sensor to detect objects based on returned light intensity.

FIG. 5C is a logical flow diagram generally showing one embodiment of a process for utilizing a single-ended sensor to detect objects based on returned light intensity.

Process 500C begins after a start block. At block 542, a power beam 106 is transmitted from a transmitter 102. In various embodiments, block 542 may employ embodiments of block 502 in FIG. 5A to transmit the power beam.

Process 500C proceeds to block 544, where a time-varying optical signal is emitted from an emitter. The time-varying optical signal is projected onto a reflector or other reflective surface (e.g., retroreflective tape) so that the signal is returned and captured by a detector.

In some embodiments, the time-varying optical signal is generated based on a time-varying electrical signal, such as a pulse or sine wave, provided by a timing source. The frequency of the time-varying electrical signal is comparable to or shorter than the round-trip light travel time from the emitter to the reflector and back to the detector, which may be referred to as t1.

In some embodiments, the time-varying optical signal is emitted as pulses of light, either directly driven by the timing source (which may be a pulse generator) or synchronized with the timing source. In other embodiments, the time-varying optical signal may be a sine-wave, square-wave, or some other modulated light, either driven by the timing source or synchronized with it. The modulation may be at a frequency comparable to 1/t1, such that one cycle of the modulation signal takes roughly one round-trip time for the time-varying optical signal to return to the detector. In at least one embodiment, the time-varying optical signal may be modulated by the combination of two sine-wave or square-wave signals at different frequencies.

Process 500C continues at block 546, where a return signal from the time-varying optical signal is received by a detector. In the absence of an intrusion object, the reflector returns at least a portion of the time-varying optical signal to the detector, which is captured by the detector. In some embodiments, the detector may be calibrated or filtered to respond only to the time-varying optical signal and not to ambient light sources.

Process 500C proceeds next to block 548, where a light-intensity value is determined for the received signal. In various embodiments, the light-intensity value is an average intensity value detected by the detector, which may be over a predetermined time period (e.g., one cycle).

Process 500C continues next at decision block 550, where a determination is made whether the light-intensity value is outside one or more threshold values. In some embodiments, if the light-intensity value falls below a first threshold, then it may be determined that an object is blocking the time-varying optical signal from returning to the detector. In other embodiments, if the light-intensity value rises above a second threshold, then it may be determined that a highly reflective object (or additional light source) is near the detector, which too may indicate that an object is blocking the time-varying signal.

In some embodiments, the threshold may be set by an operator. In other embodiments, the threshold may be determined by a calibration process. In at least one such embodiment, the light-intensity value is determined over a predetermined time period when the time-varying optical signal is not obstructed by any objects. This determined value is used as a baseline to indicate a non-blocked or non-altered time-varying optical signal, which can be used to set the one or more threshold value.

If the light-intensity value is outside the threshold value, the system determines an object blocking the time-varying optical signal, and thus an object is detected near, impeding, or about to impede (i.e., impinging on) the power beam, and process 500C flows to block 552; otherwise, process 500C returns to block 542 to continue to transmit the power beam and utilize the emitter and detector and the time-varying optical signal to detect an intrusion object.

At block 552, the power beam is stopped in response to the light-intensity value being outside the threshold value. In various embodiments, block 552 may employ embodiments of block 508 of FIG. 5A to stop the power beam.

After block 552, process 500C loops to block 544 to continue to emit/detect a time-varying optical signal to determine if the object is no longer impinging on the power beam (via blocks 544, 546, 548, and 550). If the object is no longer impinging on the power beam, the transmitter may begin retransmitting the power beam (at block 542 via block 550).

Figure 5D:
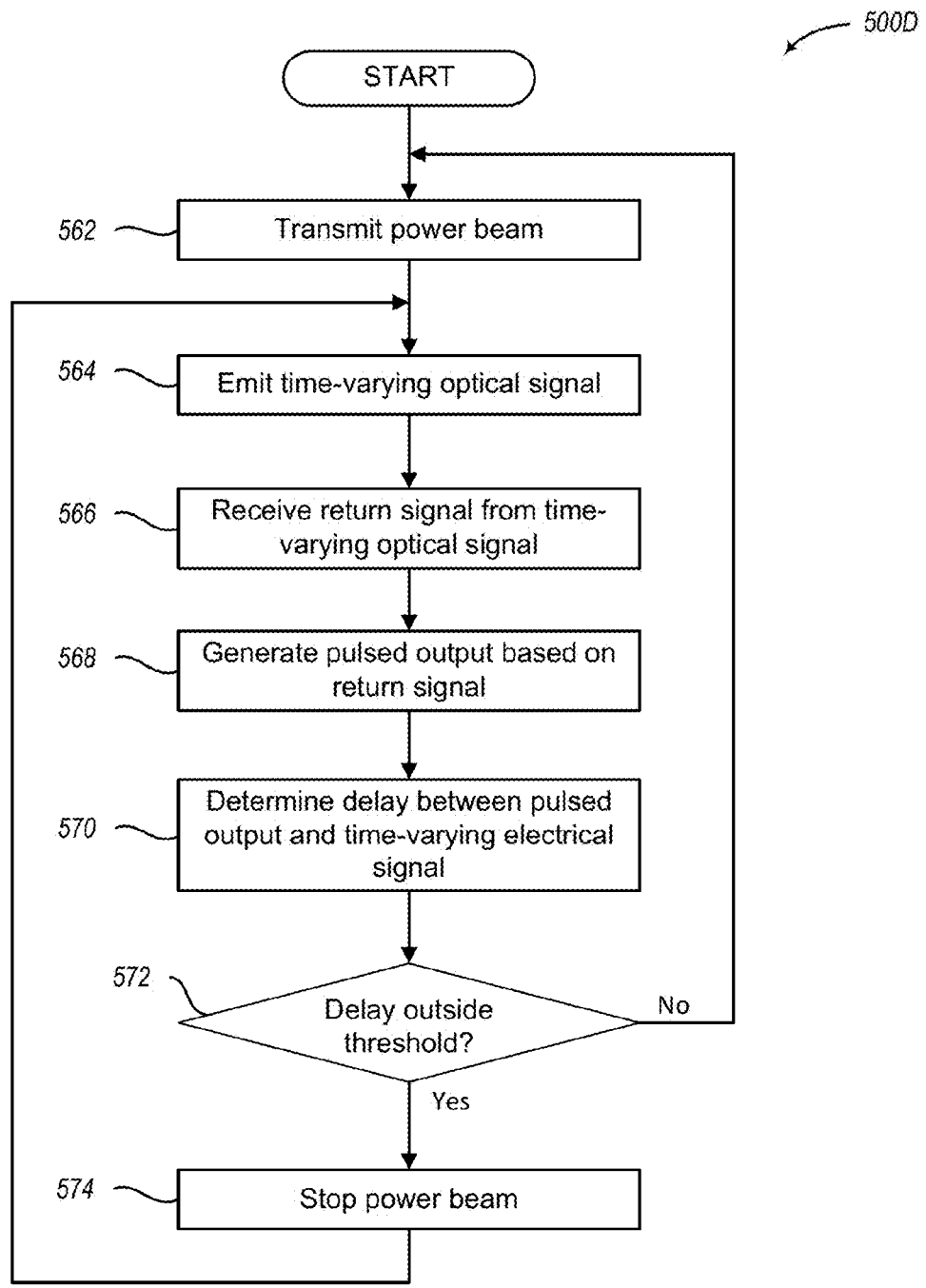
FIG. 5D is a logical flow diagram generally showing one embodiment of a process for utilizing a single-ended sensor to detect objects based on a pulsed light signal.

FIG. 5D is a logical flow diagram generally showing one embodiment of a process for utilizing a single-ended sensor to detect objects based on a pulsed light signal.

Process 500D begins after a start block. At block 562, a power beam 106 is transmitted from a transmitter 102. In various embodiments, block 562 may employ embodiments of block 502 in FIG. 5A to transmit the power beam.

Process 500D proceeds to block 564, where a time-varying optical signal is emitted from an emitter. In various embodiments, block 564 may employ embodiments of block 546 in FIG. 5C to generate and emit the time-varying optical signal.

Process 500D continues at block 566, where a return signal from the time-varying optical signal is received by a detector. In the absence of an intrusion object, the reflector returns at least a portion of the time-varying optical signal to the detector, which is captured by the detector. In some embodiments, the detector may be calibrated or filtered to respond only to the time-varying optical signal and not to ambient light sources.

Process 500D proceeds next to block 568, where a pulsed output is generated based on the returned signal. In various embodiments, the pulsed output is an electrical signal that represents the returned signal. In at least one embodiment, the pulsed output may be a digital or analog output proportional to the time of flight and updated at some measurement rate.

Process 500D continues next at block 570, where a delay between the pulsed output and the time-varying electrical signal is determined. In various embodiments, the delay is determined based on a comparison of the pulsed output and the time-varying electrical signal by calculating the difference in expected time of flight of the time-varying electrical signal and the actual time of flight of the pulsed output.

In some embodiments, the time delay is determined between the leading or trailing edge of the emitted time-varying optical signal and the corresponding edge of the returned signal (i.e., the pulsed output). In other embodiments, the phase of the returned signal is compared to the phase of the emitted time-varying optical signal to determine the time-of-flight delay. In yet other embodiments, the time-varying optical signal may be modulated by two sine-wave or square-wave signals at different frequencies, such that measuring the phase delay of both signals is used to determine the total delay.

Process 500D proceeds to decision block 572, where a determination is made whether the light delay is outside a threshold value. In some embodiments, the threshold value may be based on the predetermined roundtrip distance from the emitter to the reflector and back to the detector. In at least one embodiment the threshold may include one or more fixed or adjustable timing thresholds, such that a time of flight greater or less than a set value will indicate an object is near, impeding, or about to impede (i.e., impinging on) the power beam.

In some embodiments, the threshold may be set by an operator. In other embodiments, the threshold may be determined by a calibration process. In at least one such embodiment, the time of flight of the time-varying optical signal may be calculated when the time-varying optical signal is not obstructed by any objects. This calculated time-of-flight value is compared to the time-varying electrical signal that was used to generate the time-varying optical signal to determine the normal delay of the time-varying optical signal. This determined value is used as a baseline to indicate a non-blocked or non-altered time-varying optical signal, which can be used to set the one or more threshold value.

If the delay is outside the threshold value, the system determines an object is blocking the time-varying optical signal, and thus an object is detected near, impeding, or about to impede (i.e., impinging on) the power beam, and process 500D flows to block 574; otherwise, process 500D returns to block 562 to continue to transmit the power beam and utilize the emitter and detector and the time-varying optical signal to detect an intrusion object.

At block 574, the power beam is stopped in response to the delay being outside the threshold value. In various embodiments, block 574 may employ embodiments of block 508 of FIG. 5A to stop the power beam.

After block 574, process 500D loops to block 564 to continue to emit/detect a time-varying optical signal to determine if the object is no longer impinging on the power beam (via blocks 564, 566, 568, 570, and 572). If the object is no longer impinging on the power beam, the transmitter may begin retransmitting the power beam (at block 562 via block 572).

FIG. 6 is a system diagram of a single-ended sensing system 424 used with a power beam 106. As described elsewhere herein, a transmitter 102 generates and transmits a power beam 106 to a receiver 104. One or more single-ended sensing systems 424 may be employed with the embodiments described above for a safety sensor system that utilizes a plurality of sensors that have different or overlapping effective areas to detect objects that are near, impeding, or about to impede (i.e., impinging on) the power beam 106. The single-ended sensing system 424 incorporates range-measurement sensing along with light-intensity sensing, such that if an object enters the beam path it will be detected by a change in light intensity or, even if the object reflects or scatters light such that it is not detected directly by a change in light intensity, it will be detected because the light returns to the single-ended sensing system 424 from the wrong distance.

The single-ended sensing system 424 is positioned in proximity to the transmitter 102 such that one or more time-varying optical signals are emitted substantially parallel to the power beam 106 off a reflector 608 that is positioned in proximity to the receiver 104. The reflector 608 is positioned such that the one or more time-varying optical signals are returned to the single-ended sensing system 424 in a path that is substantially parallel to the power beam 106.

The single-ended sensing system 424 includes a timing source 612, a modulated emitter 614, a detector 616, a time-of-flight circuitry 620, an intensity-threshold circuitry 618, and a controller 622.

The timing source 612 generates a time-varying electrical signal, such as a pulse or sine wave. The pulse, sine wave, or other selected signal will have a period that is comparable to or longer than the round-trip light travel time from the modulated emitter 614 to the reflector 608 and back to the detector 616, or the pulse, sine wave, or other selected signal may have some other selected value. This period may be referred to as t1. In some embodiments, the timing source 612 is a pulse generator.

The modulated emitter 614 is coupled to the timing source 612 and configured to emit a time-varying optical signal. In the absence of an object obstructing the time-varying optical signal, the reflector 608 returns at least a portion of the time-varying optical signal to the detector 616. In some embodiments, the modulated emitter 614 may emit pulses of light, either directly driven by the timing source 612 or synchronized with the timing source 612. In other embodiments, the modulated emitter 614 may emit modulated light such as sine-wave or square-wave modulated light, either driven by the timing source 612 or synchronized with it. The modulation may be at a frequency comparable to 1/t1, such that one cycle of the modulation signal takes roughly one round-trip time for the light signal, or some other selected time. In yet other embodiments, the modulated emitter 614 may be modulated by two sine-wave or square-wave signals at different frequencies, such that measuring the phase delay of either signal separately yields an ambiguous delay time (at a measured fraction of one cycle plus an unknown integral number of full cycles) but measuring the phase delays of both signals allows solving for an unambiguous value for the total delay.

The detector 616 produces at least one output responsive to the returned time-varying optical signal. In some embodiments, the detector 616 may produce a pulsed output with high time resolution, while supplying a time-averaged output responsive to the average intensity of the received light signal. In various embodiments, both outputs may be filtered to respond only to the time-varying optical signal (e.g., the emitted pulsed signal) and not to ambient light sources.

The intensity-threshold circuit 618 is coupled to the detector 616, and produces an output (or changes the state of an output) if the average value of the detector output falls outside a threshold value—as described above in conjunction with FIG. 5C and elsewhere herein—indicating that the optical signal has been blocked, e.g., by an object entering the power beam 106.

The time-of-flight circuit 620 is coupled to both the timing source 612 and the detector 616, and produces an output responsive to the delay between the timing source signal and the corresponding detector output, as described above in conjunction with FIG. 5D and elsewhere herein. In some embodiments, the time-of-flight circuit 620 may include fixed or adjustable timing thresholds, such that a time of flight greater or less than a set value will change the state of an output. In other embodiments, the time-of-flight circuit may produce a digital or analog output proportional to the time of flight and updated at some measurement rate. In some embodiments, the time-of-flight circuit 620 may measure (using counting techniques, integrating techniques, or other techniques) the time delay between the leading or trailing edge of the emitted pulse and the corresponding edge of the detected pulse. The time-of-flight circuit 620 may compare the phase of the detected signal to the phase of the emitted signal to determine the time-of-flight delay.

The controller 622 combines outputs from the time-of-flight circuit 620 and the intensity-threshold circuit 618, and outputs an alarm signal (e.g., to executive controller 404) if the emitter-to-detector time-varying optical signals are blocked, as indicated by a threshold detection or a change in a time-of-flight output. In some embodiments, the controller 622 may have a setup mode in which it determines the normal state of its inputs, e.g., the time-of-flight inputs, and adjusts the thresholds of the intensity-threshold circuit 618 or time-of-flight circuit 620, or both, such that the normal state of the system (no object blocking the time-varying optical signal) produces no alarms. In other embodiments, the controller 622 may adjust automatically so that any time-of-flight and intensity levels that persist for more than a set period of time are treated as normal.

If an object is detected by the controller 622, the controller 622 may output an object-intrusion indication, which is used to interrupt the transmitter 102 (e.g., by executive controller 404 in FIG. 4). In other embodiments, the output of the controller 622 may be utilized to directly control and shut off (e.g., remove power from) the transmitter 102. Once the object is no longer detected, the controller 622 can output another signal indicating that no object is currently being detected and the transmitter 102 can resume generating and transmitting the power beam 106 to the receiver 104.

A likely source of accidental false intensity signals (as opposed to deliberate attempts to subvert the system using retroreflectors or similar special hardware) may be diffuse reflections or scattering from light-colored objects. Such diffuse reflectors are typically 10 to several thousand times lower gain than retroreflective tape or discrete retroreflectors (where gain quantifies the returned signal compared to an ideal Lambertian scatter at the same location). The diffuse reflectors therefore are often much closer to the single-ended sensing system 424 than the reflector 608 to produce a similar intensity—e.g., ½ to ¹/₁₀ the distance. Thus, the time-of-flight circuit 620 may not need to be highly accurate, and a simple time-delay threshold may be sufficient. However, in other cases, e.g., where a highly reflective reflector 608 cannot be used, or the area of the reflector 608 is small compared to the potential illuminated area of the interfering object, the intensity of light returned by the interfering object may be comparable to that from the reflector 608 even if the object is as far or farther from the single-ended sensing system 424 as the reflector 608. In such cases, a high resolution time-of-flight measurement may be utilized to limit the probability of a missed detection to an acceptable level. The accuracy or resolution of the time-of-flight circuitry 620 and the intensity-threshold circuitry 618 may be determined when the power beam safety sensor system is set up and based on the configuration and distance between the transmitter 102 and receiver 104.

Although FIG. 6 illustrates a single-ended sensing system 424 with a single modulated emitter 614, a single detector 616 and corresponding time-of-flight circuitry 620 and intensity-threshold circuitry 618, embodiments are not so limited. In other embodiments, the single-ended sensing system 424 may include a plurality of emitter/detector pairs, and each may include its own time-of-flight circuitry and intensity-threshold circuitry. The output from each time-of-flight circuit and from each intensity-threshold circuit may be provided to the controller 622. In at least one such embodiment, the controller can output an object-intrusion indication if the time-of-flight circuits or the intensity threshold circuits for any of the emitter/detector pairs detects an object. In other embodiments, the controller 622 may output the object-intrusion indication if the time-of-flight circuits or the intensity-threshold circuits for a plurality of the emitter/detector pairs detects an object. In this way, an object is only detected if a selected (e.g., minimum) number of emitter/detector pairs indicate the presence of an object or if a selected (e.g., minimum) number of time-of-flight circuits or intensity-threshold circuits, or a combination thereof, indicate the presence of an object.

Figure 7A:
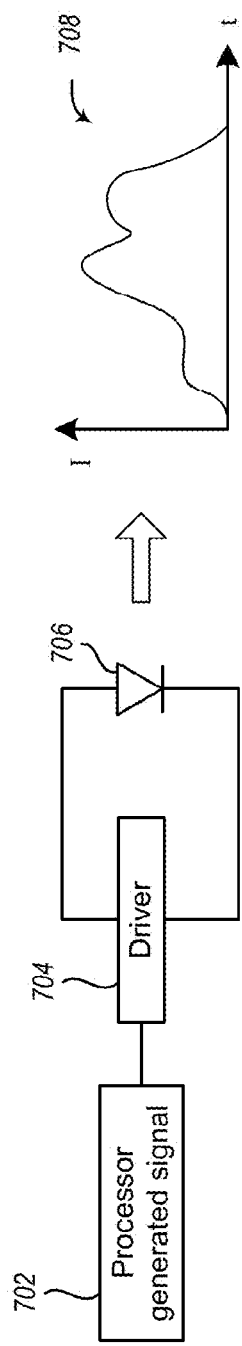
FIGS. 7A-7B illustrate example embodiments of a modulated emitter for use in a single-ended sensor.
Figure 7B:
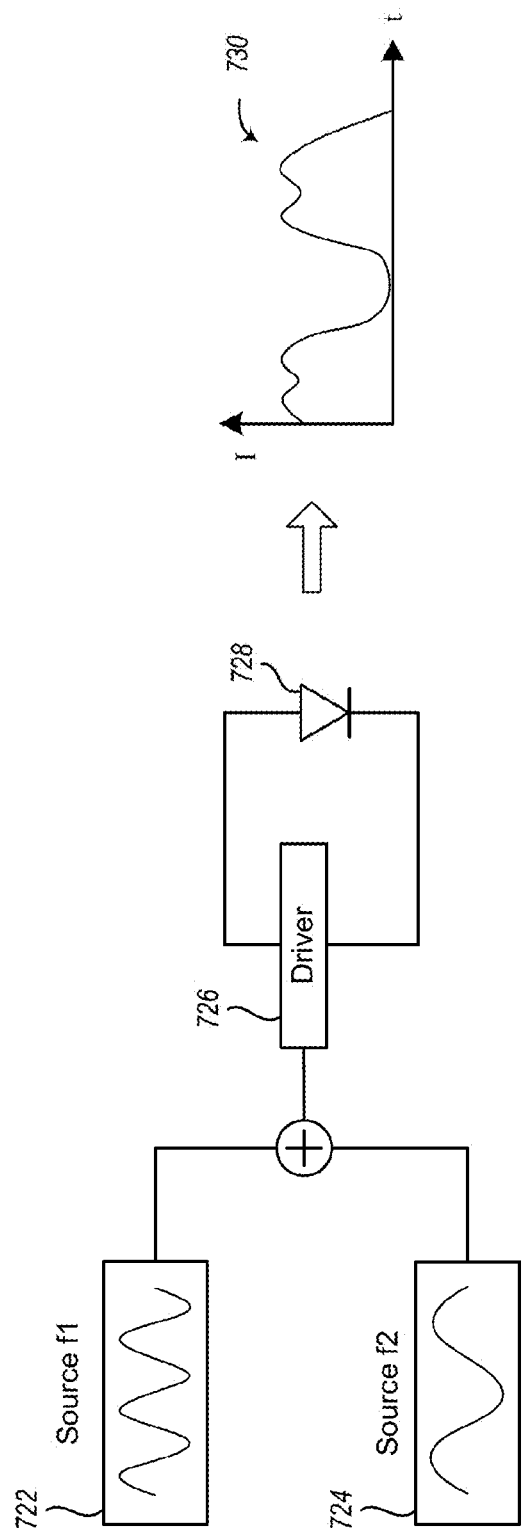

FIGS. 7A-7B illustrate example embodiments of a modulated emitter 614 for use in a single-ended sensing system 424. FIG. 7A illustrates a modulated emitter that is driven by a processor generated signal 702. As described elsewhere herein, the time-varying optical signal may be generated based on a time-varying electrical signal that is driven by or synchronized with a timing source, such as a pulse generator. In other embodiments, the time-varying electrical signal may be generated by a processor (e.g., processor 406 of FIG. 4) and provided to a driver 704. The driver 704 supplies the time-varying electrical signal to a light emitting source 706 (e.g., a light emitting diode) to create the time-varying optical signal, which is illustrated by graph 708.

FIG. 7B is similar to FIG. 7A, but different in that any number of additional timing sources may be employed. The time-varying electrical signal in FIG. 7B is generated by the combination of two timing sources 722 and 724. In some embodiments, each timing source 722 and 724 may have different frequencies or other characteristics that create a combined signal, which is provided to a driver 726. The driver 726 supplies the combined electrical signal to a light emitting source 728 (e.g., a light emitting diode) to create the time-varying optical signal, which is illustrated by graph 730.

Figure 8:
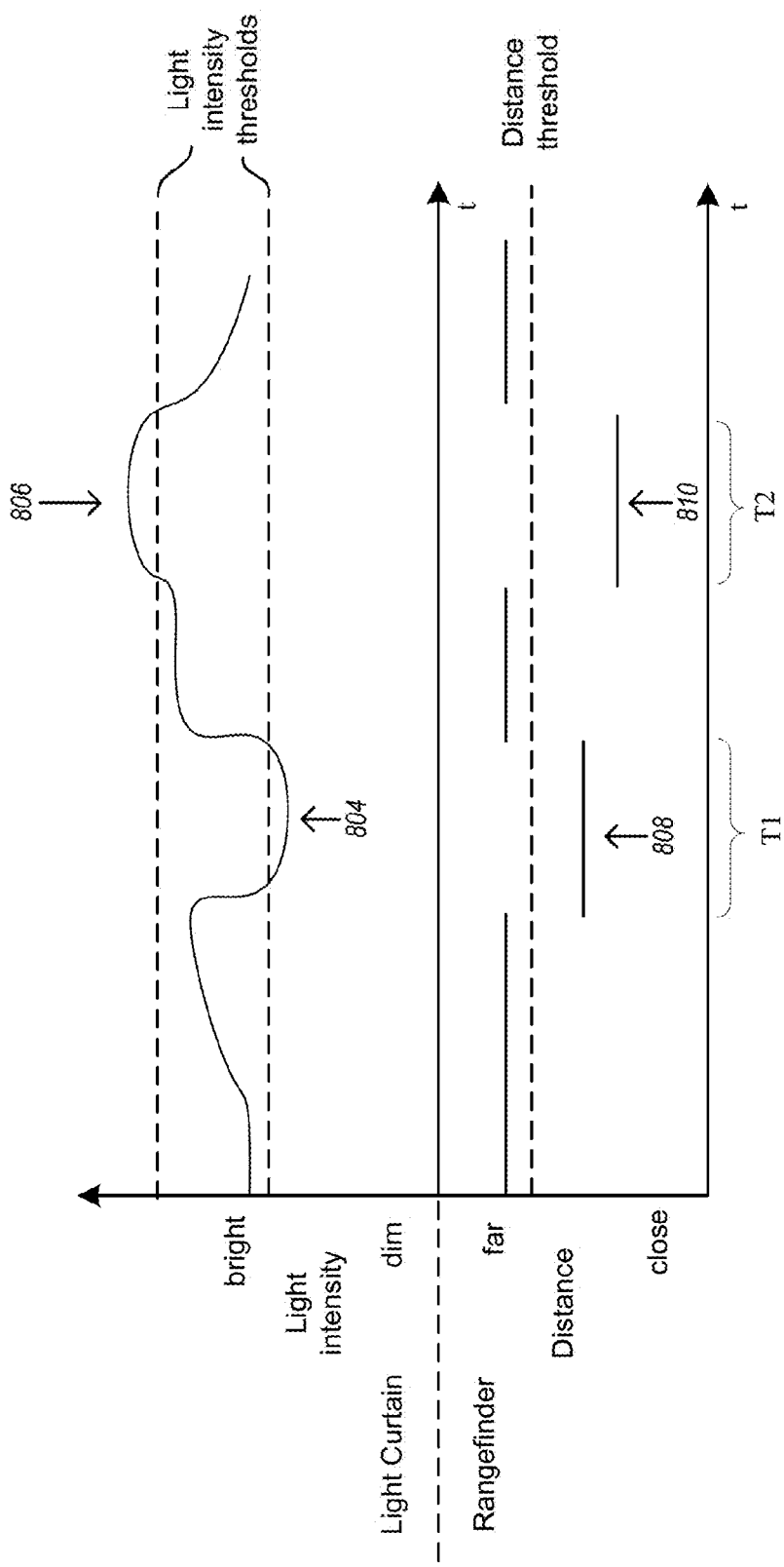
FIG. 8 is a graph illustrating an output of a multi-sensor safety system.

FIG. 8 is a graph illustrating an output of a multi-sensor safety system. In the illustrated example is the output of a light curtain and a rangefinder. As illustrated, the rangefinder may detect a possible object at T1 due to a change in the detected distance 808 falling below a threshold distance. The light curtain may also detect the object at T1 due to a change in the detected light intensity 804 falling below a first light intensity threshold. Similarly, the rangefinder may detect another possible object at T2 due to another change in the detected distance 810 falling below the threshold distance. And the light curtain may also detect the other object at T2 due to another change in the detected light intensity 806 increasing above a second light intensity threshold. In some embodiments, an indication by either the rangefinder or the light curtain may indicate that there is an object and the power beam needs to be interrupted, but in other embodiments the indication from both sensors is used to determine if there is an object near, impeding, or about to impede (i.e., impinging on) the power beam and that the power beam needs to be interrupted.

Certain words and phrases used in the present disclosure are set forth as follows. The terms "include" and "comprise," as well as derivatives thereof, mean inclusion without limitation. Unless the context requires otherwise, throughout the specification and claims which follow, the word "comprise" and variations thereof, such as, "comprises" and "comprising" are to be construed in an open, inclusive sense, e.g., "including, but not limited to." The term "or," is inclusive, meaning and/or. The phrases "associated with" and "associated therewith," as well as derivatives thereof in all grammatical forms, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation, such a device may be implemented in hardware, firmware, or software, or some combination of at least two of the same. The functionality associated with any particular controller may be centralized or distributed, whether locally or remotely. Other definitions of certain words and phrases may be provided within this patent document. Those of ordinary skill in the art will understand that in many, if not most instances, such definitions apply to prior as well as future uses of such defined words and phrases.

Where one or more figures included in the present disclosure illustrates a data flow diagram, the illustrated process is a non-limiting process that may be used by embodiments of high-flux power beam or field systems. In this regard, each described process may represent a module, segment, or portion of software code, which comprises one or more executable instructions for implementing the specified logical function(s). It should also be noted that in some implementations, the functions noted in the process may occur in a different order, may include additional functions, may occur concurrently, and/or may be omitted.

The figures in the present disclosure illustrate portions of one or more non-limiting computing device embodiments such as the power beam system embodiment 100. The computing devices may include operative hardware found in conventional computing device apparatuses such as one or more processors, volatile and non-volatile memory, serial and parallel input/output (I/O) circuitry compliant with various standards and protocols, wired and/or wireless networking circuitry (e.g., a communications transceiver), one or more user interface (UI) modules, logic, and other electronic circuitry.

Processors, such as processor 406 described herein, include central processing units (CPU's), microcontrollers (MCU), digital signal processors (DSP), application specific integrated circuits (ASIC), and the like. The processors interchangeably refer to any type of electronic control circuitry configured to execute programmed software instructions. The programmed instructions may be high-level software instructions, compiled software instructions, assembly-language software instructions, object code, binary code, micro-code, or the like. The programmed instructions may reside in internal or external memory or may be hard-coded as a state machine or set of control signals. According to methods and devices referenced herein, embodiments describe software executable by the processor and operable to execute certain ones of the method acts.

As known by one skilled in the art, a computing device has one or more memories such as memory 408, and each memory comprises any combination of volatile and non-volatile computer-readable media for reading and writing. Volatile computer-readable media includes, for example, random access memory (RAM). Non-volatile computer-readable media includes, for example, read only memory (ROM), magnetic media such as a hard-disk, an optical disk drive, a floppy diskette, a flash memory device, a CD-ROM, and/or the like. In some cases, a particular memory is separated virtually or physically into separate areas, such as a first memory, a second memory, a third memory, etc. In these cases, it is understood that the different divisions of memory may be in different devices or embodied in a single memory. The memory in some cases is a non-transitory computer medium configured to store software instructions arranged to be executed by a processor.

The computing devices illustrated herein may further include operative software found in a conventional computing device such as an operating system or task loop, software drivers to direct operations through I/O circuitry, networking circuitry, and other peripheral component circuitry. In addition, the computing devices may include operative application software such as network software for communicating with other computing devices, database software for building and maintaining databases, and task management software where appropriate for distributing the communication and/or operational workload amongst various processors. In some cases, the computing device is a single hardware machine having at least some of the hardware and software listed herein, and in other cases, the computing device is a networked collection of hardware and software machines working together in a server farm to execute the functions of one or more embodiments described herein. Some aspects of the conventional hardware and software of the computing device are not shown in the figures for simplicity.

When so arranged as described herein, each computing device may be transformed from a generic and unspecific computing device to a combination device comprising hardware and software configured for a specific and particular purpose.

Database structures, if any are present in the power beam system embodiment 100 or in other embodiments, may be formed in a single database or multiple databases. In some cases hardware or software storage repositories are shared amongst various functions of the particular system or systems to which they are associated. A database may be formed as part of a local system or local area network. Alternatively, or in addition, a database may be formed remotely, such as within a "cloud" computing system, which would be accessible via a wide area network or some other network.

Input/output (I/O) circuitry and user interface (UI) modules include serial ports, parallel ports, universal serial bus (USB) ports, IEEE 802.11 transceivers and other transceivers compliant with protocols administered by one or more standard-setting bodies, displays, projectors, printers, keyboards, computer mice, microphones, micro-electro-mechanical (MEMS) devices such as accelerometers, and the like.

In some cases, the memory 408 is a non-transitory computer readable medium (CRM). The CRM is configured to store computing instructions executable by a processor 406 of the safety system 400. The computing instructions may be stored individually or as groups of instructions in files. The files may include functions, services, libraries, and the like. The files may include one or more computer programs or may be part of a larger computer program. Alternatively or in addition, each file may include data or other computational support material useful to carry out the computing functions of a power beam system embodiment 100.

Buttons, keypads, computer mice, memory cards, serial ports, bio-sensor readers, touch screens, and the like may individually or in cooperation be useful to an operator of the power beam system embodiment 100. The devices may, for example, input control information into the system. Displays, printers, memory cards, LED indicators, temperature sensors, audio devices (e.g., speakers, piezo device, etc.), vibrators, and the like are all useful to present output information to the operator of the power beam system embodiment 100. In some cases, the input and output devices are directly or electronically coupled to a processor 406 or other operative circuitry. In other cases, the input and output devices pass information via one or more communication ports (e.g., RS-232, RS-485, infrared, USB, etc.)

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, the technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

As used in the present disclosure, the term "module" refers to an application specific integrated circuit (ASIC), an electronic circuit, a processor and a memory operative to execute one or more software or firmware programs, combinational logic circuitry, or other suitable components (i.e., hardware, software, or hardware and software) that provide the functionality described with respect to the module.

A processor (i.e., a processing unit), as used in the present disclosure, refers to one or more processing units individually, shared, or in a group, having one or more processing cores (e.g., execution units), including central processing units (CPUs), digital signal processors (DSPs), microprocessors, micro controllers, state machines, and the like that execute instructions. In the present disclosure, the terms processor in any of its grammatical forms is synonymous with the term controller.

As known by one skilled in the art, a computing device such as a computing server has one or more memories, and each memory comprises any combination of transitory and non-transitory, volatile and non-volatile computer-readable media for reading and writing. Volatile computer-readable media includes, for example, random access memory (RAM). Non-volatile computer-readable media includes, for example, read only memory (ROM), magnetic media such as a hard-disk, an optical disk drive, a flash memory device, a CD-ROM, and/or the like. In some cases, a particular memory is separated virtually or physically into separate areas, such as a first memory, a second memory, a third memory, etc. In these cases, it is understood that the different divisions of memory may be in different devices or embodied in a single memory. Some or all of the stored contents of a memory may include software instructions executable by a processing device to carry out one or more particular acts.

The terms, "real-time" or "real time," as used interchangeably herein and in the claims that follow, are not intended to imply instantaneous processing, transmission, reception, or otherwise as the case may be. Instead, the terms, "real-time" and "real time" imply that the activity occurs over an acceptably short period of time (e.g., over a period of microseconds, milliseconds, seconds, minutes or some other time frame as the context of the term's use implies), and that the activity may be performed on an ongoing basis (e.g., stopping the transmission of a high-flux power beam or field). An example of an activity that is not real-time is one that occurs over an extended period of time (e.g., hours, days, weeks, months, years, or some other time frame as the context of the term's use implies) or that occurs based on intervention or direction by a person or other activity.

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content and context clearly dictates otherwise. It should also be noted that the conjunctive terms, "and" and "or" are generally employed in the broadest sense to include "and/or" unless the content and context clearly dictates inclusivity or exclusivity as the case may be. In addition, the composition of "and" and "or" when recited herein as "and/or" is intended to encompass an embodiment that includes all of the associated items or ideas and one or more other alternative embodiments that include fewer than all of the associated items or ideas.

The headings and Abstract of the Disclosure provided herein are for convenience only and do not limit or interpret the scope or meaning of the embodiments.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A power beaming system, comprising:
    a transmitter configured to transmit a power beam;
    a receiver configured to receive the transmitted power beam and convert at least a portion of the power beam to electrical energy;
    a plurality of sensors each configured to sense at least a portion of an environment of the power beam for objects proximate to the power beam, the plurality of sensors including at least two different sensor types selected from a sensor group comprising the following types of sensors:
    radar sensors;
    lidar sensors;
    optical imaging sensors;
    thermal imaging sensors;
    passive thermal detection sensors;
    structured light sensing sensors;
    vibration sensing sensors;
    acoustic sensing sensors; and
    beam break sensing sensors,
        wherein the plurality includes at least two different members of the sensor group; and
    a first processor configured to monitor a first set of sensors of the plurality of sensors that are of a first sensor type of the sensor group,
    wherein the transmitter is configured to reduce an intensity of the transmitted power beam in response to a determination by the first processor that an object is proximate to the power beam.

2. The power beaming system of claim 1, wherein the transmitter is configured to reduce an intensity of the transmitted power beam in response to a determination by the first processor that an object is directly obstructing the power beam.

3. The power beaming system of claim 2, wherein the transmitter is configured to reduce the intensity of the transmitted power beam to within a safe level for exposure to living tissue in response to a determination by the first processor that an object is directly obstructing the power beam.

4. The power beaming system of claim 1, wherein the transmitter is configured to reduce the intensity of the transmitted power beam to within a safe level for exposure to living tissue in response to a determination by the first processor that an object is proximate to the power beam.

5. The power beaming system of claim 1, wherein the plurality of sensors includes a radar sensor or a lidar sensor that, in operation, emits at least one of either pulsed waves or a continuous wave.

6. The power beaming system of claim 1, wherein the plurality of sensors includes a radar sensor or a lidar sensor that is a single-ended emitter/detector system.

7. The power beaming system of claim 1, wherein the plurality of sensors includes an optical imaging sensor that uses a frequency selected from a group of frequencies consisting of visible light, near-infrared light, mid-infrared light, and ultraviolet light.

8. The power beaming system of claim 1, wherein the plurality of sensors includes an optical imaging sensor that is a smart camera.

9. The power beaming system of claim 1, wherein the plurality of sensors includes an optical imaging sensor that is a narrow-field camera.

10. The power beaming system of claim 1, wherein the plurality of sensors includes a thermal infrared imaging sensor that is bolometric or radiometric.

11. The power beaming system of claim 1, wherein the plurality of sensors includes an acoustic sensor that is a sonar sensor or an ultrasound sensor.

12. The power beaming system of claim 1, wherein the plurality of sensors includes a beam break sensor that is a single-ended emitter/detector sensor or a double-ended emitter/detector sensor.

13. The power beaming system of claim 1, wherein the first processor is configured to monitor a second set of the plurality of sensors that are of a second sensor type of the sensor group, the second sensor type being different from the first sensor type.

14. The power beaming system of claim 13, wherein the first processor is configured to use data obtained from monitoring both the first set of sensors and the second set of sensors to determine that an object is at risk of impinging on the power beam.

15. The power beaming system of claim 1, further comprising:
    a second processor configured to monitor a second set of the plurality of sensors that are of a second sensor type of the sensor group, the first sensor type being different from the second sensor type, wherein the transmitter is configured to reduce an intensity of the transmitted power beam in response to a determination by the second processor that an object is at risk of impinging on the power beam.

16. A method, comprising:
    controlling a transmitter to transmit a power beam;
    receiving signals from a plurality of sensors each configured to sense at least a portion of an environment of the power beam for impingement, the plurality of sensors including at least two different sensor types selected from a sensor group comprising the following types of sensors:
    radar sensors;
    lidar sensors;
    optical imaging sensors;
    thermal imaging sensors;
    passive thermal detection sensors;
    structured light sensing sensors;
    vibration sensing sensors;
    acoustic sensing sensors; and
    beam break sensing sensors, monitoring a first set of sensors of the plurality of sensors to detect a likely impingement on the power beam, the first set being sensors of a first sensor type of the sensor group; and in response to detection by a sensor of the first set of sensors of a likely impingement on the power beam, reducing an intensity of the transmitted power beam.

17. The method of claim 16, wherein reducing the intensity of the transmitted power beam includes reducing the intensity of the power beam to a safe level for exposure to living tissue.

18. The method of claim 16, wherein detection of a likely impingement on the power beam includes detection of a direct obstruction of the power beam.

19. The method of claim 16, wherein detection of a likely impingement on the power beam includes detection of a likely impingement by more than one sensor type of the sensor group.

20. A controller for a power beaming system, the controller configured to:

monitor a plurality of sensors configured to sense at least a portion of an environment of the power beam for impingement, the plurality of sensors including at least two different sensor types selected from a sensor group comprising the following types of sensors:
radar sensors;
lidar sensors;
optical imaging sensors;
thermal imaging sensors;
passive thermal detection sensors;
structured light sensing sensors;
vibration sensing sensors;
acoustic sensing sensors; and
beam break sensing sensors;

determine a likely impingement on the power beam based on signals received from a first set of the plurality of sensors, the first set being of a first sensor type of the sensor group; and control the transmitter to reduce an intensity of the transmitted power beam in response to determination of the likely impingement on the power beam.

\* \* \* \* \*